(12) United States Patent
Da Dalt

(10) Patent No.: US 9,020,089 B2
(45) Date of Patent: Apr. 28, 2015

(54) PHASE-LOCKED LOOP (PLL)-BASED FREQUENCY SYNTHESIZER

(71) Applicant: Infineon Technologies AG, Neubiberg (DE)

(72) Inventor: Nicola Da Dalt, Sattendorf (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/028,296

(22) Filed: Sep. 16, 2013

(65) Prior Publication Data

US 2015/0015308 A1 Jan. 15, 2015

Related U.S. Application Data

(60) Provisional application No. 61/845,741, filed on Jul. 12, 2013.

(51) Int. Cl.
| | |
|---|---|
| *H04L 7/033* | (2006.01) |
| *H03L 7/08* | (2006.01) |
| *H03L 7/093* | (2006.01) |
| *H03L 7/197* | (2006.01) |
| *H03L 7/091* | (2006.01) |

(52) U.S. Cl.
CPC .............. *H03L 7/093* (2013.01); *H03L 7/1972* (2013.01); *H03L 7/1974* (2013.01); *H03L 7/091* (2013.01)

(58) Field of Classification Search
CPC ..... H04L 7/033; H04L 7/0331; H04L 27/148; H04L 27/152; H04L 27/2272; H04L 2027/0065; H04L 2027/0067; H04L 2027/0069

USPC .......... 375/327, 372, 373, 375, 376; 327/147, 327/150, 151, 156, 159, 160
See application file for complete search history.

(56) References Cited

U.S. PATENT DOCUMENTS

| | | | |
|---|---|---|---|
| 5,557,241 A | 9/1996 | Burke | |
| 5,983,077 A * | 11/1999 | Dent | ............................... 455/44 |
| 6,515,553 B1 * | 2/2003 | Filiol et al. | ..................... 332/127 |
| 6,774,738 B2 | 8/2004 | Hammes et al. | |
| 7,755,439 B2 | 7/2010 | Yu et al. | |
| 7,940,142 B2 | 5/2011 | Jensen et al. | |
| 8,076,960 B2 | 12/2011 | Geng et al. | |

(Continued)

OTHER PUBLICATIONS

W.Wu et al. "A 56.4 to 63.4 GHz Spurious free All-Digital Fractional-N PLL in 65nm CMOS", Proceedings of the International Solid State Circuit Conference, ISSCC, Feb. 2013, 3 pp.

(Continued)

*Primary Examiner* — Young T Tse
(74) *Attorney, Agent, or Firm* — Shumaker & Sieffert, P.A.

(57) ABSTRACT

This disclosure describes techniques for generating signals that have relatively steep frequency profiles with a phase-locked loop (PLL) circuit architecture. In some examples, the techniques for generating signals that have relatively steep frequency profiles may include modulating an amplitude of a forward path signal in a PLL circuit at a location in a forward circuit path of the PLL circuit based on a control signal. The control signal may have an amplitude profile that is determined based on a target frequency profile to be generated by the PLL circuit. Modulating the forward circuit path of the PLL circuit with a signal that is determined based on a target frequency profile may allow a PLL-based frequency synthesizer to generate signals with relatively steep frequency profiles while still maintaining acceptable levels of phase noise.

27 Claims, 12 Drawing Sheets

(56) References Cited

U.S. PATENT DOCUMENTS

| | | | |
|---|---|---|---|
| 8,284,816 B1* | 10/2012 | Clementi | 375/130 |
| 2003/0043950 A1 | 3/2003 | Hansen et al. | |
| 2004/0192231 A1 | 9/2004 | Grewing et al. | |
| 2007/0013447 A1* | 1/2007 | Hirano et al. | 331/16 |
| 2009/0278611 A1* | 11/2009 | Cloutier et al. | 331/4 |
| 2011/0133794 A1* | 6/2011 | Dunworth et al. | 327/156 |
| 2012/0201338 A1 | 8/2012 | Leung et al. | |
| 2013/0033293 A1* | 2/2013 | Zhang | 327/156 |

OTHER PUBLICATIONS

R. Nonis et al. "A 2.4psrms Digital PLL with Multi-Output Bang-Bang Phase Detector and Phase-Interpolator-Based Fractional-N Divider", Proceedings of the International Solid State Circuit Conference, ISSCC, Feb. 2013, 3 pp.

M. Ferriss "Fractional-N Synthesizer Architectures with Digital Phase Detection", a dissertation submitted to the University of Michigan, 2008, 127 pp.

* cited by examiner

PHASE-LOCKED LOOP (PLL)-BASED FREQUENCY SYNTHESIZER

This application claims the benefit of U.S. Provisional Application No. 61/845,741, filed Jul. 12, 2013, the entire content of which is incorporated herein by reference.

TECHNICAL FIELD

This disclosure relates to frequency synthesizers, and more particularly, to phase-lock loop (PLL)-based frequency synthesizers.

BACKGROUND

Chirp signals may be used in various applications, such as, e.g., radar applications. A chirp signal may refer to a signal that corresponds to a periodic function with a frequency that varies with respect to time. The rate at which the frequency of a chirp signal changes with respect to time may be referred to as the chirp rate.

Frequency synthesizers are commonly used to generate frequency modulated signals from a common reference signal. One type of frequency synthesizer is a phase-locked loop (PLL)-based frequency synthesizer that uses a PLL circuit to generate an output signal that is either an integer multiple of or a fractional multiple of a reference signal. With PLL-based frequency synthesizers, however, it is difficult to generate chirp signals with relatively high chirp rates while still maintaining a relatively low level of phase noise.

SUMMARY

This disclosure describes techniques for generating signals that have relatively steep frequency profiles with a phase-locked loop (PLL) circuit architecture. In some examples, the techniques for generating signals that have relatively steep frequency profiles may include modulating an amplitude of a forward path signal in a PLL circuit at a location in a forward circuit path of the PLL circuit based on a control signal. The control signal may have an amplitude profile that is determined based on the target frequency profile to be generated by the PLL circuit. Modulating the forward circuit path of the PLL with a signal that is determined based on a target frequency profile may allow a PLL-based frequency synthesizer to generate output signals that have relatively steep frequency profiles (e.g., a high chirp rate) with a relatively low slew rate PLL loop filter. Using a relatively low slew rate PLL loop filter may allow the PLL circuit to generate an output signal with relatively low phase noise. In this way, a PLL-based frequency synthesizer may be used to generate signals with relatively steep frequency profiles while still maintaining acceptable levels of phase noise.

In one example, this disclosure describes a method that includes modulating a division factor used for performing fractional-N frequency division in a phase-locked loop (PLL) circuit based on a target frequency profile to be generated by the PLL circuit. The method further includes performing fractional-N frequency division on an output signal of the PLL circuit based on the modulated division factor to generate a feedback signal. The method further includes generating a forward path signal in the PLL circuit based on a reference signal and the feedback signal. The method further includes modulating an amplitude of the forward path signal at a location in a forward circuit path of the PLL circuit based on a control signal. The control signal has an amplitude profile that is determined based on the target frequency profile to be generated by the PLL circuit. The method further includes generating the output signal of the PLL circuit based on the modulated amplitude of the forward path signal of the PLL circuit such that a frequency profile of the output signal substantially corresponds to the target frequency profile.

In another example, this disclosure describes a device that includes a PLL circuit configured to modulate a division factor used for performing fractional-N frequency division based on a target frequency profile to be generated by the PLL circuit. The PLL circuit is further configured to perform fractional-N frequency division on an output signal of the PLL circuit based on the modulated division factor to generate a feedback signal. The PLL circuit is further configured to generate a forward path signal based on a reference signal and the feedback signal. The PLL circuit is further configured to modulate an amplitude of the forward path signal at a location in a forward circuit path of the PLL circuit based on a control signal. The control signal has an amplitude profile that is determined based on the target frequency profile to be generated by the PLL circuit. The PLL circuit is further configured to generate the output signal of the PLL circuit based on the modulated amplitude of the forward path signal such that a frequency profile of the output signal substantially corresponds to the target frequency profile.

In another example, this disclosure describes an apparatus that includes means for modulating a division factor used for performing fractional-N frequency division in a phase-locked loop (PLL) circuit based on a target frequency profile to be generated by the PLL circuit. The apparatus further includes means for performing fractional-N frequency division on an output signal of the PLL circuit based on the modulated division factor to generate a feedback signal. The apparatus further includes means for generating a forward path signal in the PLL circuit based on a reference signal and the feedback signal. The apparatus further includes means for modulating an amplitude of the forward path signal at a location in a forward circuit path of the PLL circuit based on a control signal. The control signal has an amplitude profile that is determined based on the target frequency profile to be generated by the PLL circuit. The apparatus further includes means for generating the output signal of the PLL circuit based on the modulated amplitude of the forward path signal of the PLL circuit such that a frequency profile of the output signal substantially corresponds to the target frequency profile.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
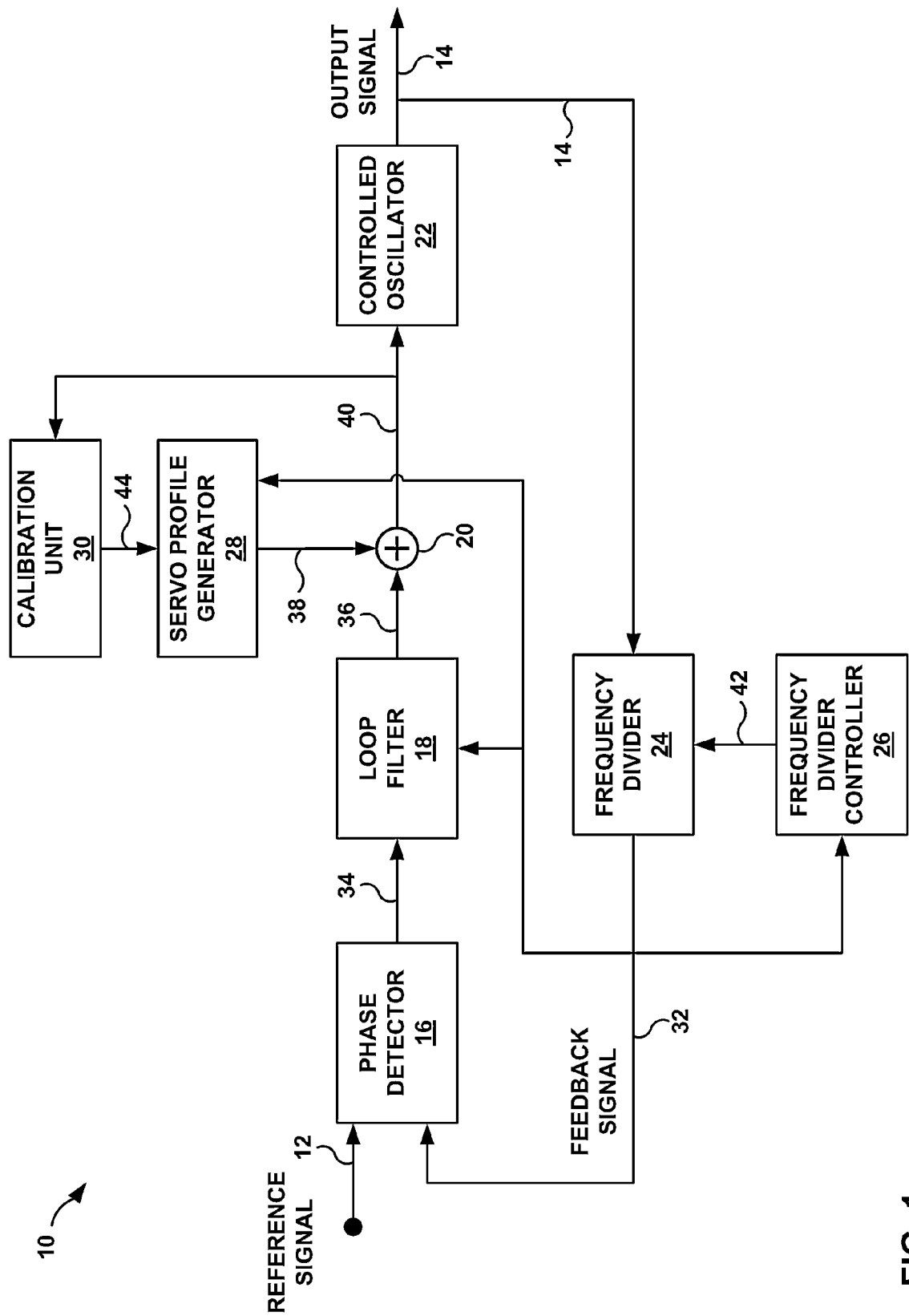
FIG. 1 is a block diagram illustrating an example phase-locked loop (PLL) circuit that may be used to perform the PLL-based frequency synthesizer techniques of this disclosure.

This disclosure describes techniques for generating signals that have relatively steep frequency profiles with a phase-locked loop (PLL) circuit architecture. In some examples, the techniques for generating signals that have relatively steep frequency profiles may include modulating an amplitude of a forward path signal in a PLL circuit at a location in a forward circuit path of the PLL circuit based on a control signal. The control signal may have an amplitude profile that is determined based on the target frequency profile to be generated by the PLL circuit. Modulating the forward circuit path of the PLL with a signal that is determined based on a target frequency profile may allow a PLL-based frequency synthesizer to generate output signals that have relatively steep frequency profiles (e.g., a high chirp rate) with a relatively low slew rate PLL loop filter. Using a relatively low slew rate PLL loop filter may allow the PLL circuit to generate an output signal with relatively low phase noise. In this way, a PLL-based frequency synthesizer may be used to generate signals with relatively steep frequency profiles while still maintaining acceptable levels of phase noise.

One technique for generating a chirp signal (e.g., a signal whose frequency varies with respect to time) is to use an analog PLL-based frequency synthesizer. An analog PLL circuit used in such a synthesizer, however, may have several drawbacks. For example, the analog PLL circuit may have a relatively high sensitivity to power supply variations, the analog PLL circuit may have a relatively low level of robustness to process variations, and the analog PLL circuit may have a limited amount of programming flexibility. Moreover, the analog loop filter included in the analog PLL circuit may consume a relatively large amount of chip area.

In some examples, the techniques of this disclosure may use a digital PLL-based frequency synthesizer to generate signals that have relatively steep frequency profiles. For example, a digital PLL circuit included in such a synthesizer may include, in some examples, a digital phase detector and a digital loop filter. Using a digital PLL circuit to generate signals that have relatively steep frequency profiles may, in some examples, reduce the area required to implement the loop filter relative to analog PLL circuits, reduce the sensitivity to the power supply relative to analog PLL circuits, increase the robustness of the output signal to process variations relative to analog PLL circuits, and/or increase the programming flexibility of the circuit relative to analog.

One approach for designing a digital PLL circuit for use in a digital PLL-based frequency synthesizer is to use a time-to-digital converter (TDC) for the phase detector in the digital PLL. However, a TDC-based phase detector may suffer from several drawbacks. For example, a TDC-based phase detector may consume a relatively large amount of power and may cause increased circuit complexity on the analog design side of a frequency synthesizer if other analog components are used.

In some examples, the techniques of this disclosure may use a binary phase a binary phase detector (BPD) (i.e., a bang-bang phase detector) to perform the phase detection in a digital PLL circuit. Using a binary phase detector to perform the phase detection in a digital PLL circuit may reduce the power consumption of the PLL circuit relative to PLL circuits that use time-to-digital converter (TDC)-based phase detectors and/or decrease the complexity of the analog portion of PLL circuit relative to PLL circuits that use TDC-based phase detectors.

One drawback of conventional digital PLL circuits that use binary phase detectors, however, is that due to the limited resolution of the binary phase detector, such circuits typically have relatively low maximum frequency slew rates. Although it is possible to adjust other parameters in the PLL circuit to increase the maximum frequency slew rate of the PLL circuit, adjusting such parameters may increase the phase noise of the circuit. For example, the maximum frequency slew rate of a conventional PLL circuit that uses a binary phase detector may be directly proportional to the integral gain factor of the loop filter. Raising the integral gain factor of the loop filter, however, may increase the amount of phase noise produced by the PLL circuit. Therefore, conventional PLL circuits that use binary phase detectors are typically not capable of generating output signals with relatively steep frequency profiles and relatively low phase noise.

In some examples, the techniques of this disclosure may modulate a PLL forward circuit path with a signal that is determined based on a target frequency profile to be generated by the PLL circuit. Modulating the PLL forward signal path based on the target frequency profile may allow, in some examples, a PLL circuit to support a higher slew rate without requiring other parameters to be adjusted in the PLL circuit that, if otherwise adjusted, would increase the amount of phase noise produced by the PLL circuit. For example, the PLL forward signal path modulation techniques described in this disclosure may allow a PLL circuit to support a higher slew rate without requiring the integral gain factor of the loop filter to be increased. In this way, the techniques of this disclosure may be used to allow a digital PLL circuit that uses binary phase detectors to generate output signals with relatively steep frequency profiles while maintaining relatively low phase noise.

In some examples, the control signal used to modulate the forward signal path may have an amplitude profile that is determined based on the target frequency profile of the output signal to be generated by the PLL circuit. The amplitude profile of a control signal may be a function that defines the amplitude of the control signal as a function of time. The target frequency profile may be a function that defines a target frequency for the output signal as a function of time.

In some cases, the amplitude profile of the control signal may be determined based on the target frequency profile of the output signal in the sense that, at each of a plurality of instances in time, the amplitude of the control signal may be approximately equal to a value that is carried by a particular node in the forward signal path of the PLL circuit when the PLL circuit is locked at a respective one of a plurality of frequencies in the target frequency profile that corresponds to the respective instance in time. A frequency of the target frequency profile may correspond to a particular instance in time if the function that defines the target frequency profile maps the particular instance in time to the target frequency. A PLL circuit may be locked at a particular frequency when the PLL circuit is operating in a steady state condition and is generating an output signal that has the particular frequency.

In some examples, the node in the forward signal path of the PLL circuit may be located between the loop filter of the PLL circuit and the controlled oscillator of the PLL circuit. In further examples, the node in the forward signal path of the PLL circuit may be located inside of loop filter of the PLL circuit.

Using a control signal that has an amplitude profile which is determined based on the target frequency profile of the PLL circuit may allow the input signal to the controlled oscillator of the PLL circuit to have a relatively high slew rate without requiring the loop filter to support such a slew rate. Allowing the input of the controlled oscillator to have a relatively high slew rate may allow the frequency slew rate of the PLL circuit to also be relatively high. Because the loop filter does not need to support the relatively high slew rate of the input to the controlled oscillator, the loop filter design parameters may be configured to generate signals with relatively low amounts of phase noise. In this way, a PLL circuit may be able to generate output signals with high frequency slew rates with relatively low amounts of phase noise.

In some examples, the shape of the amplitude profile of the control signal may be substantially the same as the shape of the target frequency profile for the output signal. For example, the amplitude profile of the control signal may be a scaled version of the target frequency profile to be generated by the PLL circuit.

In further examples, the shape of the amplitude profile for the control signal may be based on the shape of the target frequency profile for the output signal and further based on a transfer function for a controlled oscillator in the PLL circuit. For example, the shape of the target frequency profile may be transformed based on a transfer function of the controlled oscillator to generate the shape of the amplitude profile. Using a transformed target frequency profile may allow the control signal to compensate for non-linear controlled oscillator transfer functions.

In some examples, the amplitude profile of the control signal may be determined empirically prior to, during, and/or subsequent to manufacture of the frequency synthesizer. For example, for each of a plurality of frequencies in a target frequency profile, a value that is carried by a particular node in the forward signal path of the PLL circuit when the PLL circuit is locked at the frequency may be determined. The amplitude profile for the control signal may be determined by mapping each of the frequencies in the frequency profile to a corresponding value that was empirically determined.

In some examples, the control signal that is used to modulate the forward signal path may be a digital signal. In examples where the PLL circuit described in this disclosure is implemented as a digital PLL (e.g., the phase detector is a digital phase detector and the loop filter is a digital loop filter), using a digital control signal to modulate the forward signal path may allow the control signal to be applied to the forward signal path without requiring the use of a digital-to-analog converter (DAC).

In further examples, the control signal may be stored in a digital format. For example, a set of values that correspond to the control signal may be stored in a digital storage device (e.g., a memory, a set of registers, etc.). In examples where the PLL circuit described in this disclosure is implemented as a digital PLL (e.g., the phase detector is a digital phase detector and the loop filter is a digital loop filter), storing the control signal in a digital format may allow the control signal to be generated during the operation of the PLL circuit without requiring the use of a DAC.

Power supply voltage variations and temperature variations may oftentimes cause changes in the operating characteristics of the controlled oscillator of a PLL circuit and/or in a digital-to-analog converter (DAC) of the PLL circuit if one is used. These variations may cause the values carried by the various nodes in the PLL circuit when the PLL circuit is locked to a particular frequency to change during the operation of the PLL circuit. If the control signal is a static control signal that does not change during the operation of the device, then the changes in steady state values may result in the control signal not inserting optimal values into the control loop of the PLL circuit.

According to this disclosure, techniques are described for calibrating the control signal used to modulate the forward signal path of a PLL circuit in order account for variations in operation conditions (e.g., power supply variations and temperature variations). In some examples, an initial calibration technique may be performed prior to the PLL circuit generating real-time output frequency profiles. In additional examples, a background calibration technique may be performed while the PLL circuit is generating real-time output frequency profiles. In further examples, both the initial and background calibration techniques may be performed for a given set of frequency profiles that are generated.

The initial frequency calibration technique may involve locking the PLL circuit at a plurality of calibration frequencies, and for each of the calibration frequencies, sampling values at a node in the forward signal path of the PLL circuit. The node in the forward signal path may be the same as the node at which the forward signal path is modulated during generation of the frequency profiles. The sampled values may be used to generate the control signal that is used to modulate the forward signal path of the PLL circuit. In examples where the control signal is stored in a digital format, the sampled values may be stored in a digital storage device.

The background calibration technique may involve detecting when the controlled oscillator output passes each of a plurality of calibration frequencies when generating an instance of the frequency profile, and sampling a value at the node in the forward signal path of the PLL circuit in response to detecting the output of the controlled oscillator passed through one of the calibration frequencies. The node in the forward signal path may be the same as the node at which the forward signal path is modulated during generation of the frequency profiles. The samples values may be used to generate the control signal that modulates the forward signal path during generation of a subsequent instance of the frequency profile. In examples where the control signal is stored in a digital format, the sampled values may be stored in a digital storage device. In some cases, the sampled values may overwrite one or more previously sampled values stored in the digital storage device.

Using sampled values from the PLL control loop to calibrate the control signal may allow the control signal to compensate for variations in operating conditions, such as, e.g., variations power supply levels and variations in temperature. In this way, a PLL-based frequency synthesizer may be able leverage the high slew rate/low phase noise advantages achieved by using the forward signal path modulation techniques of this disclosure while generating output signals that are more robust to variations in power supply levels and/or variations in temperature.

In some examples, the output signal frequency profile generation techniques of this disclosure may be used to perform non-linear operations on frequency profiles. For example, the techniques of this disclosure may be used to generate output signals having frequency profiles that include one or more discontinuities. If a PLL circuit merely uses a fractional-N divider to adjust the frequency of the PLL circuit, an abrupt change in the division factor (N) would be smoothed out by the loop filter. The techniques of this disclosure, however, may be used to insert abrupt amplitude changes into the forward signal path at a point where such changes would not be smoothed out by the loop filter. In this way, the techniques of this disclosure may be used to generate frequency profiles that have non-linear characteristics and/or discontinuities.

In some examples, the techniques of this disclosure may be used to generate output signals that have a frequency profile that corresponds to a ramp function. A ramp function may be a function where at least a portion of the function starts at a first instance in time at a first frequency and ends at a second instance of time at a second frequency and has a substantially constant slope between the first instance in time and the second instance in time. In some examples, a signal that has a ramp function frequency profile may correspond to a linear chirp.

In further examples, the techniques of this disclosure may be used to generate chirps for use in radar applications. Radars typically have a sweep signal that is oftentimes defined as a linear chirp (e.g., a signal that has a ramp frequency profile). Future radar designs are often specifying steeper and steeper frequency profiles. In such examples, the techniques of this disclosure may be used, in some examples, to provide a frequency synthesizer that is able to support the relatively steep frequency profiles used in current and future radar standards while maintaining acceptable levels of phase noise.

FIG. 1 is a block diagram illustrating an example PLL circuit 10 that may be used to perform the PLL-based frequency synthesizer techniques of this disclosure. PLL circuit 10 is configured to receive a reference signal 12, and to generate an output signal 14 based on reference signal 12 such that output signal 14 has a frequency profile that conforms to a target frequency profile. PLL circuit 10 may be implemented according to a variety of PLL architectures including, for example, an analog PLL architecture, a digital PLL architecture, and an all digital PLL architecture. PLL circuit 10 includes a phase detector 16, a loop filter 18, a summing node 20, a controlled oscillator 22, a frequency divider 24, a frequency divider controller 26, a servo profile generator 28, and a calibration unit 30.

Reference signal 12 may be a periodic signal that oscillates at a fixed frequency. Reference signal 12 may be shaped according to any of a variety of waveform shapes including, e.g., a square wave and a sinusoid wave. In some examples, reference signal 12 may be generated by an oscillator that oscillates at a fixed frequency, such as, e.g., a crystal-controlled oscillator and/or a quartz-crystal controlled-oscillator.

Output signal 14 may be a signal that has a frequency profile that is determined by a target frequency profile for PLL circuit 10. In some examples, output signal 14 may be a chirp signal. A chirp signal may refer to a signal that corresponds to a periodic function with a frequency that varies with respect to time. The rate at which the frequency of a chirp signal changes with respect to time may be referred to as the chirp rate. The frequency profile of output signal 14 may be a function that describes how the frequency of output signal 14 varies with respect to time.

In some examples, the frequency profile for output signal 14 may be periodic. For example, PLL circuit 10 may be configured to generate output signal 14 such that output signal 14 includes a periodic sequence of chirp signals. Each chirp signal in the periodic sequence of chirp signals may be generated during a respective one of a plurality of cycles. In such examples, the frequency profile for output signal 14 may be said to conform to the target frequency profile for PLL circuit 10 if the frequency profile for each of the cycles (i.e., periods) of output signal 14 conforms to the target frequency profile.

In some cases, the frequency profile for each chirp signal in the sequence of chirp signals may be referred to as an instance of the target frequency profile. In such cases, PLL circuit 10 may be said to generate output signal 14 such that the frequency profile for output signal 14 includes a plurality of instances of the target frequency profile and/or a sequence of instances of the target frequency profile.

In some examples, the target frequency profile may be a ramp function. In such examples, PLL circuit 10 may generate output signal 14 such that output signal 14 has a frequency profile that corresponds to a ramp function. A ramp function may be a function where at least a portion of the function starts at a first instance in time at a first frequency and ends at a second instance of time at a second frequency and has a substantially constant slope between the first instance in time and the second instance in time.

In further examples, the frequency profile may correspond to a sawtooth function. A sawtooth function may be a type of ramp function. A sawtooth function may include a first portion and a second portion. The first portion may start at a first instance in time at a first frequency and end at a second instance of time at a second frequency. The first portion of the sawtooth function may have a substantially constant slope between the first instance in time and the second instance in time. The second portion of the sawtooth function may start at the second instance of time at the second frequency and switch to the first frequency at a third instance of time that is immediately subsequent to the second instance of time. In other words, the second portion of the sawtooth function may cause the frequency profile to abruptly reset to the initial frequency of the sawtooth function.

In additional examples, the frequency profile may correspond to a triangle function. A triangle function may be a type of ramp function. A triangle function may include a first portion and a second portion. The first portion may start at a first instance in time at a first frequency and end at a second instance of time at a second frequency. The first portion of the triangle function may have a substantially constant slope between the first instance in time and the second instance in time. The second portion of the triangle function may start at the second instance of time at the second frequency and end at a third instance of time at the first frequency. The second portion of the triangle function may have a substantially constant slope between the second instance in time and the third instance in time.

The ramp, sawtooth, and triangle frequency profiles described above are merely examples of target frequency profiles that may be used with the techniques of this disclosure. In other examples, other types of linear and/or non-linear frequency profiles may be used, such as e.g., up/down ramps, exponential frequency profiles, etc.

Phase detector 16 is configured to receive reference signal 12 and a feedback signal 32, and to generate a phase difference signal 34 based on reference signal 12 and feedback signal 32. Phase difference signal 34 may be indicative of a phase difference between reference signal 12 and phase difference signal 34. Phase difference signal 34 may be a digital signal or an analog signal depending on the implementation of PLL circuit 10. To generate phase difference signal 34, phase detector 16 may determine a phase difference between reference signal 12 and feedback signal 32 using any of a variety of phase determination techniques known in the art. Determining the phase difference between reference signal 12 and feedback signal 32 may correspond, in some examples, to determining the phase of reference signal 12 relative to the phase of feedback signal 32.

In some examples, phase detector 16 may determine the sign of the phase difference between reference signal 12 and feedback signal 32 without necessarily determining the magnitude of the phase difference between reference signal 12 and feedback signal 32. In such examples, phase detector 16 may generate phase difference signal 34 such that phase difference signal 34 is indicative of a sign of the phase difference between reference signal 12 and feedback signal 32.

In further examples, phase detector 16 may determine the sign and magnitude of the phase difference between reference signal 12 and feedback signal 32. In such examples, phase detector 16 may, in some examples, generate phase difference signal 34 such that phase difference signal 34 is indicative of a sign and/or magnitude of the phase difference between reference signal 12 and feedback signal 32.

In some examples, phase detector 16 may be a digital phase detector. In examples where phase detector 16 is a digital phase detector, phase detector 16 may be, in some examples, a binary phase detector (i.e., a bang-bang phase detector). In additional examples, phase detector 16 may be an analog phase detector or a digital phase detector other than a binary phase detector (e.g., a time-to-digital converter (TDC)-based phase detector).

In examples where phase detector 16 is a binary phase detector, phase detector 16 may be configured to generate a value of positive one or a value of negative one based on the sign of the phase difference between reference signal 12 and feedback signal 32. In some examples, the binary phase detector may include a sequential circuit element (e.g., a flip-flop) that is configured to receive feedback signal 32 as a clocking input to the sequential circuit element and to receive reference signal 12 as a data input to the sequential circuit element. In such examples, the sequential circuit element may be configured to capture the value of reference signal 12 when a clocking event (e.g., a positive or negative edge) occurs in feedback signal 32, and generate phase difference signal 34 based on the captured value of reference signal 12.

Feedback signal 32 may correspond to a frequency-divided version of output signal 14. In some examples, the division factor used to generate feedback signal 32 may be an integer division factor. In further examples, the division factor used to generate feedback signal 32 may be a fractional division factor.

Loop filter 18 is configured to receive phase difference signal 34, and to generate a filtered signal 36 based on phase difference signal 34. Filtered signal 36 may correspond to a filtered version of phase difference signal 34. In some examples, loop filter 18 may be a digital loop filter. In examples where loop filter 18 is a digital loop filter, loop filter 18 may, in some examples, be a digital proportional-integral (PI) loop filter. In further examples, loop filter 18 may be an analog loop filter or a digital loop filter other than a digital PI loop filter. For example, loop filter 18 may be a proportional-integral-derivative (PID) loop filter, an integrator, a low-pass filter, etc.

In examples where loop filter 18 is a PI loop filter, loop filter 18 may perform PI filtering on phase difference signal 34 to generate filtered signal 36. In such examples, filtered signal 36 may be indicative of a PI filtered version of phase difference signal 34.

In examples where loop filter 18 is a digital PI loop filter, loop filter 18 may, in some examples, include a sequential circuit element (e.g., a register) that is configured to receive feedback signal 32 as a clocking input to the sequential circuit element. In some cases, the sequential circuit element may be an accumulator that accumulates previously received values of phase difference signal 34. In cases where loop filter 18 does not include a sequential circuit element that receives feedback signal 32 as a clocking input and/or in cases where loop filter 18 is an analog loop filter, then the feedback path shown in FIG. 1 between frequency divider 24 and loop filter 18 may be omitted.

Summing node 20 is configured to receive filtered signal 36 and a servo control signal 38, and to generate composite signal 40 based on filtered signal 36 and servo control signal 38. Summing node 20 may add the amplitude of servo control signal 38 to the amplitude of filtered signal 36 to generate composite signal 40. Thus, summing node 20 may be said to modulate an amplitude of filtered signal 36 based on servo control signal 38.

Controlled oscillator 22 is configured to receive composite signal 40, and to generate output signal 14 based on composite signal 40. Controlled oscillator 22 may generate output signal 14 such that output signal 14 corresponds to a periodic function with a frequency that is determined based on the amplitude of composite signal 40. In some examples, the periodic function may be a square wave. In further examples, the periodic function may be a sinusoid wave. As the amplitude of composite signal 40 increases, the frequency of output signal 14 may increase. Similarly, as the amplitude of composite signal 40 decreases, the frequency of output signal 14 may decrease.

In some examples, controlled oscillator 22 may be an analog signal-controlled oscillator, such as, e.g. a voltage-controlled oscillator (VCO). In further examples, controlled oscillator 22 may be a digitally-controlled oscillator (DCO).

Frequency divider 24 is configured to receive output signal 14 and a frequency divider control signal 42, and to generate feedback signal 32 based on output signal 14 and frequency divider control signal 42. Frequency divider control signal 42 may be indicative of a division factor (N) to be used for dividing the frequency of output signal 14. Frequency divider 24 may generate feedback signal 32 such that the frequency of feedback signal 32 is approximately equal to the quotient of the frequency of output signal 14 divided by N. In other words, frequency divider 24 may divide the frequency of output signal 14 by N to generate feedback signal 32.

In some examples, frequency divider 24 may be an integer-N frequency divider that is configured to divide the frequency of output signal 14 by an integer factor (N). In further examples, frequency divider 24 may be a fractional-N frequency divider that is configured to divide the frequency of output signal 14 by an integer or fractional factor (N). In examples where frequency divider 24 is a fractional-N divider, frequency divider 24 may, in some examples, be implemented as a phase interpolator (PI)-based fractional-N divider as discussed in further detail later in this disclosure.

Frequency divider controller 26 is configured to generate frequency divider control signal 42 based on a target frequency profile to be generated by PLL circuit 10. In cases where the frequency in the target frequency profile varies with respect to time, frequency divider controller 26 may be configured to modulate the division factor (N) specified by frequency divider control signal 42 based on the target frequency profile.

Modulating the division factor (N) may be used to change the output frequency of PLL circuit 10 such that output signal 14 conforms to the target frequency profile. However, if the rate of change of the frequency in the frequency profile is relatively high, the slew rate limitations caused by phase detector 16 and/or loop filter 18 may prevent PLL circuit 10 from accurately tracking the changes in frequency, particularly in cases where phase detector 16 is implemented as a binary phase detector. In some cases, the slew rate of PLL circuit 10 may be improved by adjusting the filter parameters of loop filter 18 (e.g., the integral term of loop filter 18 may be increased). However, such adjustments typically result in a significant increase in phase noise.

According to this disclosure, servo profile generator 28 is configured to generate servo control signal 38 based on a target frequency profile to be generated by PLL circuit 10, and to insert servo control signal 38 into the forward signal path of PLL circuit 10. Inserting servo control signal 38 into the forward signal path of PLL circuit 10 may involve modulating (e.g., via summing node 20) an amplitude of filtered signal 36 based on servo control signal 38. Inserting servo control signal 38 into the forward signal path of PLL circuit 10 may allow PLL circuit 10 to generate output signal 14 such that output signal 14 can track frequency profiles that have relatively high rates of change even though loop filter 18 may have a relatively low slew rate. Using a relatively low slew rate loop filter 18 may allow PLL circuit 10 to generate an output signal with relatively low phase noise. In this way, PLL circuit 10 may be used to generate frequency profiles with relatively high rates of change while still maintaining acceptable levels of phase noise.

In some examples, servo profile generator 28 may generate servo control signal 38 such that servo control signal 38 has an amplitude profile that is determined based on the target frequency profile of output signal 14. The amplitude profile of a control signal may be a function that defines the amplitude of the control signal as a function of time. The target frequency profile may be a function that defines a target frequency for the output signal as a function of time.

In some cases, the amplitude profile of servo control signal 38 may be determined based on the target frequency profile of output signal 14 in the sense that, at each of a plurality of instances in time, the amplitude of servo control signal 38 may be approximately equal to a value that is carried by a particular node in the forward signal path (e.g., composite signal 40) of PLL circuit 10 when PLL circuit 10 is locked at a respective one of a plurality of frequencies in the target frequency profile that corresponds to the respective instance in time. A frequency of the target frequency profile may correspond to a particular instance in time if the function that defines the target frequency profile maps the particular instance in time to the target frequency. PLL circuit 10 may be locked at a particular frequency when PLL circuit 10 is operating in a steady state condition and is generating an output signal that has the particular frequency.

In the example shown in FIG. 1, the node in the forward signal path of PLL circuit 10 that is modulated by servo control signal 38 may be located between loop filter 18 and controlled oscillator 22 of PLL circuit 10. In further examples, the node may be located in other places of the forward signal path of PLL circuit 10. For example, the node may be located inside of loop filter 18 of PLL circuit 10. In general, the forward signal path of PLL circuit 10 may refer to the signal path between phase detector 16 and controlled oscillator 22 of PLL circuit 10, and the feedback signal path of PLL circuit 10 may refer to the signal path from controlled oscillator 22 to frequency divider 24 and from frequency divider 24 to various other components in PLL circuit 10.

Generating servo control signal 38 such that servo control signal 38 has an amplitude profile which is determined based on the target frequency profile to be generated by PLL circuit 10 may allow the input signal of controlled oscillator 22 (i.e., composite signal 40) to have a relatively high slew rate without requiring loop filter 18 to support such a slew rate. Allowing the input of the controlled oscillator 22 to have a relatively high slew rate may allow the frequency slew rate of PLL circuit 10 to also be relatively high. Because loop filter 18 does not need to support the relatively high slew rate, the filtering parameters for loop filter 18 may be configured to generate signals with relatively low amounts of phase noise. In this way, PLL circuit 10 may be able to generate output signals with high frequency slew rates with relatively low amounts of phase noise.

In some examples, the shape of the amplitude profile of servo control signal 38 may be substantially the same as the shape of the target frequency profile for output signal 14. For example, the amplitude profile of servo control signal 38 may be a scaled version of the target frequency profile of output signal 14.

In further examples, the shape of the amplitude profile for servo control signal 38 may be based on the shape of the target frequency profile for output signal 14 and further based on a transfer function for controlled oscillator 22. For example, the shape of the target frequency profile may be transformed based on a transfer function of controlled oscillator 22 to generate the shape of the amplitude profile for servo control signal 38. Using a transformed target frequency profile may allow servo control signal 38 to compensate for any non-linearities in the transfer function of controlled oscillator 22.

In some examples, the amplitude profile of servo control signal 38 may be determined empirically prior to, during, and/or subsequent to manufacture of the frequency synthesizer. For example, for each of a plurality of frequencies in a target frequency profile, a value that is carried by a particular node (e.g., a node between loop filter 18 and controlled oscillator 22) in the forward signal path of PLL circuit 10 when PLL circuit 10 is locked at the frequency may be determined. The amplitude profile for servo control signal 38 may be determined by mapping each of the frequencies in the frequency profile to a corresponding value that was empirically determined. In some cases, the resulting values may be target and stored in a digital storage device for retrieval by servo profile generator 28.

In some examples, servo control signal 38 may be a digital signal. For example, servo control signal 38 may include a sequence of digital values where each digital value corresponds to a particular instance of time in the target frequency profile. In such examples, the digital value corresponding to a particular instance in time may, in some examples, be equal to a value that causes controlled oscillator 22 to generate a particular frequency of output signal that corresponds to the frequency that is mapped to the particular instance in time by the frequency profile. Using a digital servo control signal 38 to modulate the forward signal path of PLL circuit 10 may allow servo control signal 38 to be applied to the forward signal path without requiring the use of a digital-to-analog converter (DAC).

In some examples servo profile generator 28 may include or be communicatively coupled to a digital storage device (e.g., a memory or a set or registers) that stores the values of servo control signal 38. In such examples, servo profile generator 28 may be configured to retrieve the digital values from the digital storage device, and generate servo control signal 38 based on the retrieved digital values.

In some examples, the digital values may be stored as a look-up table in the digital storage device (e.g., a memory), and servo profile generator 28 may retrieve the values from the look-up table and generate servo control signal 38 based on a plurality of digital values stored in the look-up table. For example, for each of a plurality of time intervals, servo profile generator 28 may generate servo control signal 38 such that the value of servo control signal 38 during the respective time interval corresponds to a respective one of a plurality of values in the look-up table. In some examples, the time interval used to switch between different look-up table values may be a substantially periodic time interval. In further examples, the time interval used to switch between different look-up table values may be controlled based on feedback signal 32. For example, for each edge transition of feedback signal 32 (e.g., positive edge transition or negative edge transition), servo profile generator 28 may switch the digital value to be output as servo control signal 38 to a different value and hold that value until the next transition of feedback signal 32. The amplitude profile formed by the values in the look-up table may correspond to the target frequency profile to be generated by PLL circuit 10.

In some examples, servo profile generator 28 may be a digital circuit block. In such examples, servo profile generator 28 may, in some examples, include one or more sequential circuit elements (e.g., flip-flops) that are each configured to receive feedback signal 32 as a clocking input. In some cases, for each clock cycle, servo profile generator 28 may output a respective one of the digital values in the sequence of digital values that form servo control signal 38. In such cases, the sequential circuit elements may be used to control when servo profile generator 28 switches from outputting a current digital value to outputting a subsequent digital value in the sequence of digital values. In cases where servo profile generator 28 does not include a sequential circuit element that receives feedback signal 32 as a clocking input and/or in cases where servo profile generator 28 is an analog circuit, then the feedback path shown in FIG. 1 between frequency divider 24 and servo profile generator 28 may be omitted.

Power supply voltage variations and temperature variations may cause changes in the operating characteristics of controlled oscillator 22 and/or in a digital-to-analog converter (DAC) (not shown) if one is used. These variations may cause the values carried by the various nodes in PLL circuit 10 when PLL circuit 10 is locked to a particular frequency to change during the operation of PLL circuit 10. If the servo control signal 38 is a static control signal that does not change during the operation of the device, then the changes in steady state values may result in servo control signal 38 not inserting optimal values into the control loop of the PLL circuit.

According to this disclosure, calibration unit 30 may calibrate servo control signal 38 in order to account for variations in operation conditions (e.g., power supply variations and temperature variations). The calibration may be performed by sampling one or values in the PLL control loop (e.g. composite signal 40) while the PLL is operating in steady state conditions and/or while the PLL is generating particular frequency profiles. Using sampled values from the PLL control loop to calibrate servo control signal 38 may allow servo control signal 38 to compensate for variations in operating conditions, such as, e.g., variations in power supply levels and/or variations in temperature. In this way, a PLL-based frequency synthesizer may be able leverage the high slew rate/low phase noise advantages achieved by using the forward signal path modulation techniques of this disclosure while generating output signals that are more robust to variations in power supply levels and/or temperature.

Calibration unit 30 is configured to sample composite signal 40, and calibrate servo control signal 38 based on the sampled values of composite signal 40. In some examples, composite signal 40 may generate one or more calibration signals 44 to cause servo profile generator 28 to calibrate servo control signal 38. In cases where servo control signal 38 is stored as a sequence of digital values in a digital storage device, calibration signals 44 may cause servo profile generator 28 to replace all or part of the sequence of digital values with a sequence of one or more calibrated values generated by calibration unit 30. In some examples, the calibrated values may correspond to the values sampled by calibration unit 30. In further examples, calibration unit 30 may generate the calibrated values based on the sampled values.

Calibration unit 30 may be configured to perform one or both of an initial calibration technique and a background calibration technique. The initial calibration technique may be performed, in some examples, prior to PLL circuit 10 generating real-time output frequency profiles. The background calibration technique may be performed, in some examples, while PLL circuit 10 is generating real-time output frequency profiles.

To perform the initial frequency calibration technique, calibration unit 30 may cause PLL circuit 10 to lock at a plurality of calibration frequencies. For each of the calibration frequencies, calibration unit 30 may sample values at a node in the forward signal path of PLL circuit 10. The node in the forward signal path which is used for sampling may be the same as the node which is used for modulating the forward signal path. The sampled values may be used to calibrate servo control signal 38. In examples where the control signal is stored in a digital format, calibration unit 30 may, in some examples, store the sampled values in a digital storage device.

To perform the background calibration technique, calibration unit 30 may detect when output signal 14 passes each of a plurality of calibration frequencies when generating an instance of the frequency profile, and sample a value at a node in the forward signal path of PLL circuit 10 in response to detecting that the frequency of output signal 14 passed through one of the calibration frequencies. The node in the forward signal path which is used for sampling may be the same as the node which is used for modulating the forward signal path. The sampled values may be used to generate values to be used for servo control signal 38 during generation of a subsequent instance of the frequency profile. In examples where the control signal is stored in a digital format, calibration unit 30 may, in some examples, store the sampled values in a digital storage device. In some cases, the sampled values may overwrite one or more previously sampled values stored in the digital storage device.

In some examples, PLL circuit 10 may be used to perform non-linear operations on frequency profiles. For example, PLL circuit 10 may be used to insert abrupt amplitude changes into the forward signal path of PLL circuit 10 at a point where such changes would not be smoothed out by loop filter 18. In this way, the techniques of this disclosure may be used to generate frequency profiles that have non-linear characteristics and/or discontinuities.

In further examples, the techniques of this disclosure may be used to generate chirps for use in radar applications.

Radars typically have a sweep signal that is oftentimes defined as a linear chirp (e.g., a signal that has a ramp frequency profile). Future radar designs are often specifying steeper and steeper frequency profiles. In such examples, the techniques of this disclosure may be used, in some examples, to provide a frequency synthesizer that is able to support the relatively steep frequency profiles used in current and future radar standards while maintaining acceptable levels of phase noise.

Although the example PLL circuit 10 includes a calibration unit 30, it should be noted that, in other examples, calibration unit 30 may be omitted. In further examples, calibration unit 30 may be integrated with servo profile generator 28. In additional examples, some or all of the functionality of one or more of frequency divider controller 26, servo profile generator 28, and calibration unit 30 may be integrated into a common circuit block. Each of the components of PLL circuit 10 may be implemented as analog circuitry, digital circuitry, or a combination of analog and digital circuitry.

It should be noted that reference signal 12, output signal 14, feedback signal 32, phase difference signal 34, filtered signal 36, servo control signal 38, composite signal 40 frequency divider control signal 42 and calibration signals 44 may be any combination of digital signals and analog signals depending on the implementation of PLL circuit 10. It should further be noted that one or more analog-to-digital converters (ADCs) and digital-to-analog converters (DACs) may be inserted into the PLL signal paths to accommodate various combinations of digital and analog signals.

It should be further noted that one or both of frequency divider control signal 42 and servo control signal 38 may be filtered prior to being applied to, respectively, frequency divider 24 and the forward signal path of PLL circuit 10 (via summing node 20). For example, a first filter may be placed between frequency divider controller 26 and frequency divider 24, and a second filter may be placed between servo profile generator 28 and summing node 20. The first filter may filter frequency divider control signal 42 according to a first filtering function to generate a filtered version of frequency divider control signal 42, and provide the filtered version of frequency divider control signal 42 to frequency divider 24 to control the division factor used by frequency divider 24. The second filter may filter servo control signal 38 according to a second filtering function to generate a filtered version of servo control signal 38, and provide the filtered version of servo control signal 38 to summing node 20 to modulate the forward signal path of PLL circuit 10. In cases where both frequency divider control signal 42 and servo control signal 38 are filtered, in some examples, the filtering functions used to filter frequency divider control signal 42 may be different than the filtering functions used to filter servo control signal 38. In other words, for the example first and second filters described above, the first filtering function implemented be the first filter may be different than the second filtering function implemented by the second filter.

Figure 2:
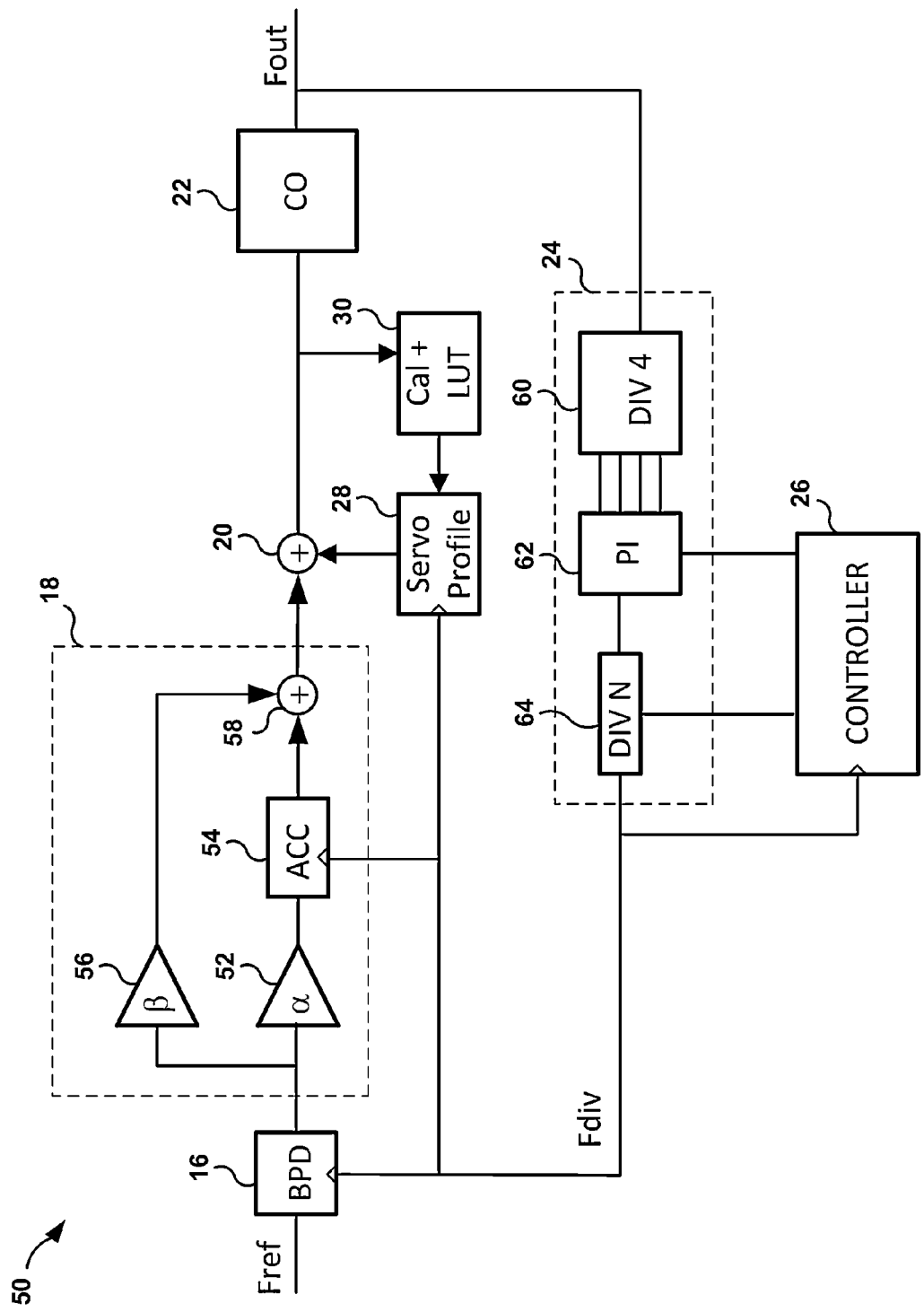
FIG. 2 is a block diagram illustrating another example PLL circuit that may be used to perform the PLL-based frequency synthesizer techniques of this disclosure.

FIG. 2 is a block diagram illustrating another example PLL circuit 50 that may be used to perform the PLL-based frequency synthesizer techniques of this disclosure. In some examples, PLL circuit 50 may be used to implement PLL circuit 10 shown in FIG. 1. PLL circuit 50 is configured to receive a reference signal (i.e., Fref), and to generate an output signal (i.e., Fout) based on the reference signal. PLL circuit 50 may be an example of a digital PLL architecture and/or an all digital PLL architecture. PLL circuit 50 includes a phase detector 16, a loop filter 18, a summing node 20, a controlled oscillator 22, a frequency divider 24, a frequency divider controller 26, a servo profile generator 28, and a calibration unit 30.

PLL circuit 50 includes the same general components as those shown in FIG. 1 except that particular implementations for phase detector 16, loop filter 18 and frequency divider 24 are included in PLL circuit 50. Components that have the same numbers between FIGS. 1 and 2 have already been described above with respect to FIG. 1. Accordingly, in the interest of brevity and to avoid redundancy, such components will not be described in further detail.

As shown in FIG. 2, instead of a general phase detector 16 as shown in FIG. 1, phase detector 16 has been implemented as a binary phase detector (BPD). As illustrated in FIG. 2, phase detector 16 may include a clocking input that is configured to receive a frequency-divided version (i.e., Fdiv) of the PLL output signal (i.e., Fout). In some examples, the binary phase detector may include a sequential circuit element (e.g., a flip-flop) that is configured to receive the clocking input. In such examples, the sequential circuit element may be configured to capture the value of the reference signal (i.e., Fref) when a clocking event (e.g., a positive or negative edge) occurs in the frequency-divided version (i.e., Fdiv) of the output signal, and generate a phase difference signal based on the captured value of the reference signal (i.e., Fref).

The loop filter 18 depicted in FIG. 2 may be a proportional-integral loop filter, which includes an integral gain block 52, an accumulator 54, a proportional gain block 56, and a summing node 58. Integral gain block 52 represents the integral gain factor of the proportional-integral loop filter. Accumulator 54 is an accumulator that is configured to integrate the phase difference signal received from phase detector 16 via integral gain block 52. Collectively, integral gain block 52 and accumulator 54 generate the integral term of the proportional-integral loop filter based on the integral gain factor of the proportional-integral loop filter. Proportional gain block 56 generates the proportional term of the proportional-integral loop filter based on the proportional gain factor of the proportional-integral loop filter. Summing node 58 adds the integral term to the proportional term in order to generate a proportional-integral filtered version of the phase difference signal generated by phase detector 16.

As shown in FIG. 2, accumulator 54 may be a sequential circuit element (e.g., a register) that receives a frequency-divided version (i.e., Fdiv) of the output signal as a clocking input to the sequential circuit element. In response a clocking event (e.g., a positive or negative edge) that occurs in the frequency-divided version (i.e., Fdiv) of the output signal, accumulator 54 may add the phase difference received from phase detector 16 (as modified by integral gain block 52) to the value already stored in accumulator 54. Accumulating the phase difference signal in this manner may provide integration functionality for loop filter 18.

The frequency divider 24 depicted in FIG. 2 may be a phase interpolator (PI)-based fractional-N divider, which includes a fixed division factor prescaler block 60, a PI block 62, and a programmable division factor prescaler block 64. Fixed division factor prescaler block 60 is configured to receive the output signal of PLL circuit 50, and to generate a plurality of frequency-divided versions of the output signal based on a fixed integer frequency division factor. The plurality of frequency-divided versions of the output signal may be phase-shifted with respect to one another. In the example PLL circuit 50 of FIG. 2, fixed division factor prescaler block 60 generates four frequency-divided versions of the output signal, each of which has a frequency of one-quarter of the frequency of the output signal (i.e., Fout) of PLL circuit 50.

Each of the frequency-divided versions of the output signal may be phase-shifted with respect to adjacent frequency-divided versions by one-quarter of the period of the frequency-divided signal.

PI block 62 is configured to receive the plurality of frequency-divided versions of the output signal from fixed division factor prescaler block 60, and to generate a phase-interpolated signal. The phase-interpolated signal may have the same frequency as the plurality of frequency-divided versions of the output signal, but may be a phase-shifted version of one or more of the plurality of frequency-divided versions of the output signal. In some cases, PI block 62 may be configured to shift the phase of one of the plurality of frequency-divided versions of the output signal by a fractional amount of the total period of the frequency-divided versions of the output signal. The fractional amount of the period may be configurable to be different than the fractional amount of period by which each of the frequency-divided versions of the output signal is phase-shifted with respect to each other. The amount by which PI block 62 phase-shifts one of the input signals may be programmed by frequency divider controller 26.

Programmable division factor prescaler block 64 is configured to receive the phase-interpolated signal from PI block 62, and to generate a frequency-divided version of the phase-interpolated signal based on a programmable integer frequency division factor. The programmable frequency division factor may be programmed by frequency divider controller 26.

Frequency divider controller 26 may program PI block 62 and programmable division factor prescaler block 64 to generate a fractionally-divided signal (i.e., Fdiv) that is a frequency-divided version of the output signal of PLL circuit 50 (i.e., Fout). The aggregate division factor between the output signal of PLL circuit 50 (i.e., Fout) and the signal generated by programmable division factor prescaler block 64 may be a fractional division factor. Notably, the fractionally-divided signal is obtained with integer-based frequency dividers. A PI-based fractional-N divider may provide a solution for performing fractional-N dividing while generating relatively low amounts of quantization noise.

Figure 3:
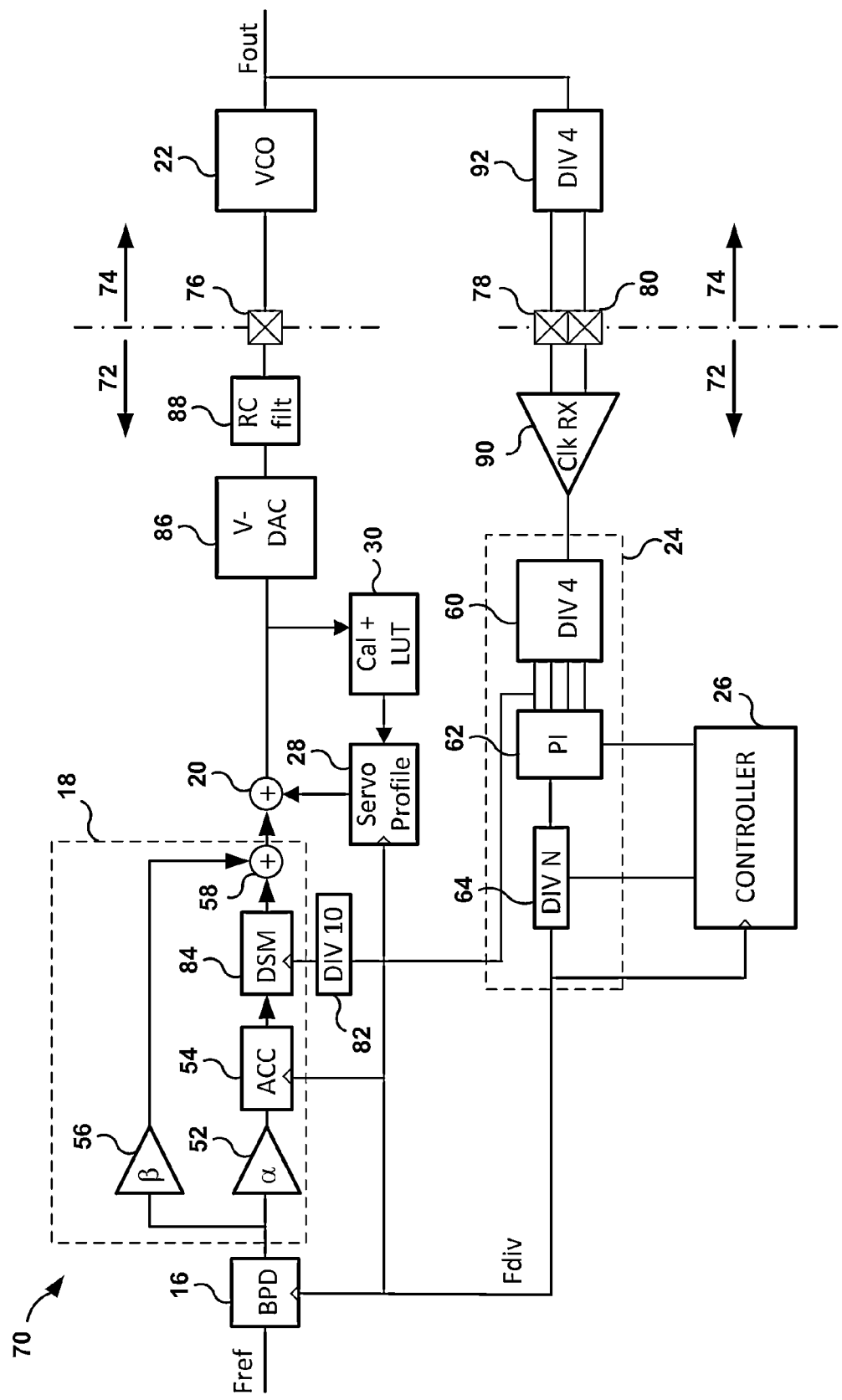
FIG. 3 is a block diagram illustrating another example phase-locked loop (PLL) circuit that may be used to perform the PLL-based frequency synthesizer techniques of this disclosure.

FIG. 3 is a block diagram illustrating another example PLL circuit 70 that may be used to perform the PLL-based frequency synthesizer techniques of this disclosure. In some examples, PLL circuit 70 may be used to implement PLL circuit 10 shown in FIG. 1 and/or PLL circuit 50 shown in FIG. 2. PLL circuit 70 is configured to receive a reference signal (i.e., Fref), and to generate an output signal (i.e., Fout) based on the reference signal. PLL circuit 70 may be an example of a digital PLL architecture that uses a digital phase detector 16, a digital loop filter 18, a digital frequency divider 24, and an analog-controlled oscillator 22 (i.e., a VCO).

As shown in FIG. 3, the digital components and the analog components are disposed on separate microchips. More specifically, PLL circuit 70 includes a digital chip 72, an analog chip 74, and terminals 76, 78, 80. Each of terminals 76, 78, 80 represents an interconnection between digital chip 72 and analog chip 74. In some examples, each of terminals 76, 78, 80 may represent a pin on digital chip 72 and a corresponding pin on analog chip 74. Digital chip 72 includes a phase detector 16, a loop filter 18, a summing node 20, a frequency divider 24, a frequency divider controller 26, a servo profile generator 28, a calibration unit 30, a prescaler 82, a delta-sigma modulator 84, a V-DAC 86, a resistance-capacitance (RC) filter 88, and a buffer 90. Analog chip 74 includes a voltage controlled oscillator 22 and a prescaler 92.

PLL circuit 70 may include several components that are similar to the components shown in FIG. 2. Components that have the same numbers between FIGS. 2 and 3 have already been described above with respect to FIG. 2. Accordingly, in the interest of brevity and to avoid redundancy, such components will not be described in further detail.

Prescaler 82 is configured to generate a frequency-divided version of the one of the output signals of fixed division factor prescaler block 60 based on a frequency division factor of 10. Delta-sigma modulator 84 is configured to perform delta-sigma modulation on the signal generated by accumulator 54 based on the frequency-divided signal generated by prescaler 82. Prescaler 82 and delta-sigma modulator 84 may be used to reduce the phase noise produced by loop filter 18.

Although the example PLL circuit 70 shown in FIG. 3 illustrates the clock signal for delta-sigma modulator 84 as being taken from the output of fixed division factor prescaler block 60, in other examples, the clock signal for delta-sigma modulator 84 may be taken from other locations included in PLL circuit 70 as well as locations that are external to PLL circuit 70. In general, any frequency may be fed into the clock input of delta-sigma modulator 84 that is higher than the frequency of the reference signal (i.e., Fref).

V-DAC 86 is configured to convert the composite signal (which is a digital signal) generated by summing node 20 into an analog signal. RC filter 88 is configured to low pass filter the analog signal generated by V-DAC 86. Converting the composite signal to an analog signal and low-pass filtering the analog signal may allow an analog VCO to be used in PLL circuit 70.

Prescaler 92 is configured to divide the frequency of the output signal (i.e., Fout) by a factor of four to generate a frequency-divided output signal. Buffer 90 is configured to act as an input buffer for the frequency-divided output signal, and to pass the frequency-divided input signal to frequency divider 24.

Figure 4:
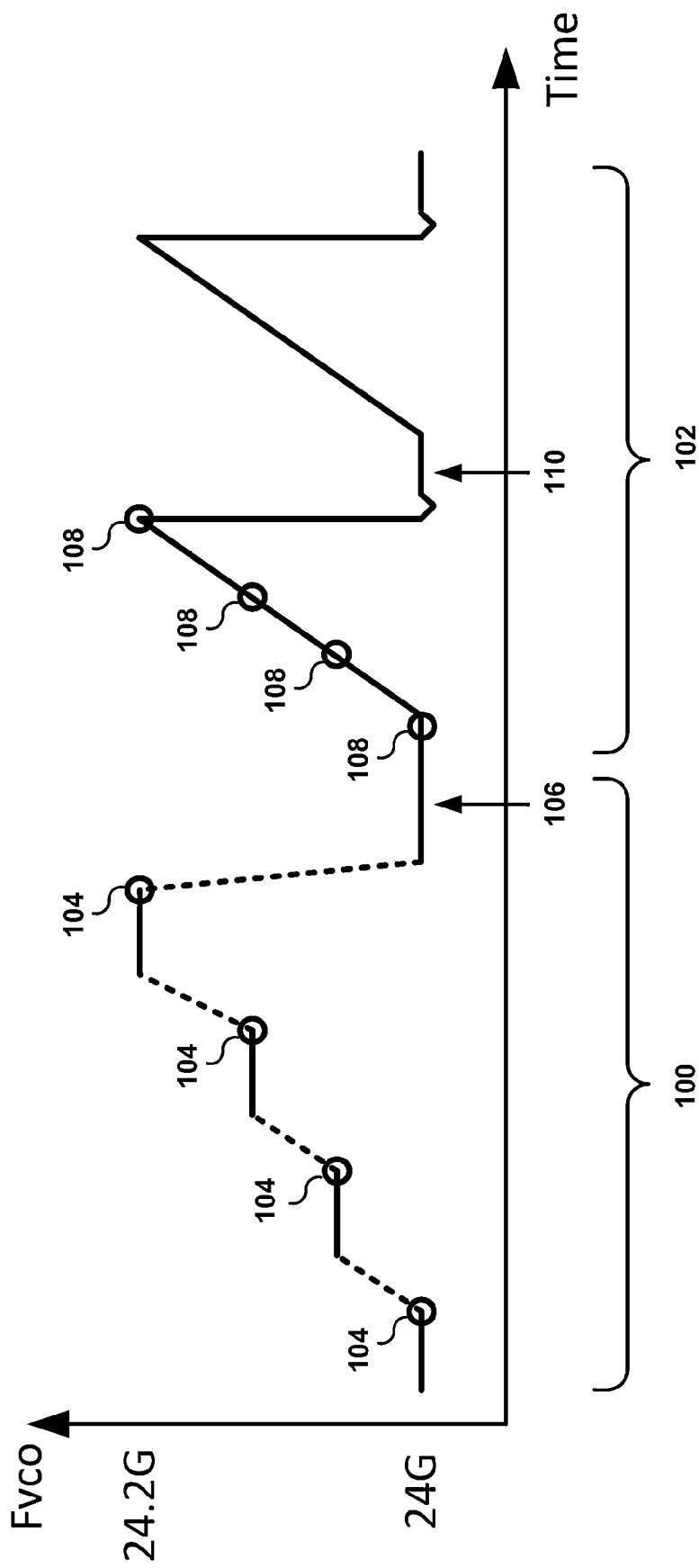
FIG. 4 is a conceptual diagram illustrating example servo control signal calibration techniques according to this disclosure.

FIG. 4 is a conceptual diagram illustrating example servo control signal calibration techniques according to this disclosure. The conceptual diagram includes a graph of output frequency (i.e., Fvco) versus time. The graph includes an initial calibration portion 100 and a background calibration portion 102. During initial calibration portion 100, calibration unit 30 causes PLL circuit 10 to lock at a plurality of calibration frequencies 104. At each of calibration frequencies 104, calibration unit 30 may sample a value at a location in the forward signal path of the PLL and store the sampled values in a digital format (e.g., a look-up table) in a digital storage device. The location in the forward signal path of PLL may correspond to the location at which the forward signal path of the PLL is modulated. The sampled values may form a multi-point servo ramp. At time instance 106, calibration unit 30 may update the multiple-point servo-ramp based on the sampled values. In other words, calibration unit 30 may cause servo profile generator 28 to generate servo control signal 38 for the next ramp instance based on the sampled values that were obtained during the initial calibration.

During background calibration portion 102, PLL circuit 10 generates an output signal having the target frequency profile. In the example shown in FIG. 4, PLL circuit 10 generates two different instances of a ramp frequency profile during background calibration portion 102. Each of the instances of the ramp frequency profile may be alternatively referred to as an instance of a sawtooth frequency profile, which may be a type of ramp frequency profile. While generating a first instance of the ramp frequency profile during background calibration portion 102, calibration unit 30 samples the value (e.g., amplitude) at a location in the forward signal path of PLL circuit 10 as output signal 14 of PLL circuit 10 passes through a plurality of calibration frequencies 108. The location in the forward signal path of PLL circuit 10 may correspond to the location at which the forward signal path of PLL circuit 10 is modulated. Calibration unit 30 may store the sampled values in a digital format (e.g., a look-up table) in a digital storage device. At time instance 110, calibration unit 30 may update the multiple-point servo-ramp based on the sampled values. In other words, calibration unit 30 may update the sampled values stored in the look-up table or another digital format. Servo profile generator 28 may generate servo control signal 38 for the next instance of the ramp frequency profile based on the updated sampled values. In this way, servo profile generator 28 may generate servo control signal 38 for a next instance of the ramp frequency profile based on the sampled values obtained during generation of a previous instance of the ramp frequency profile.

Figure 5:
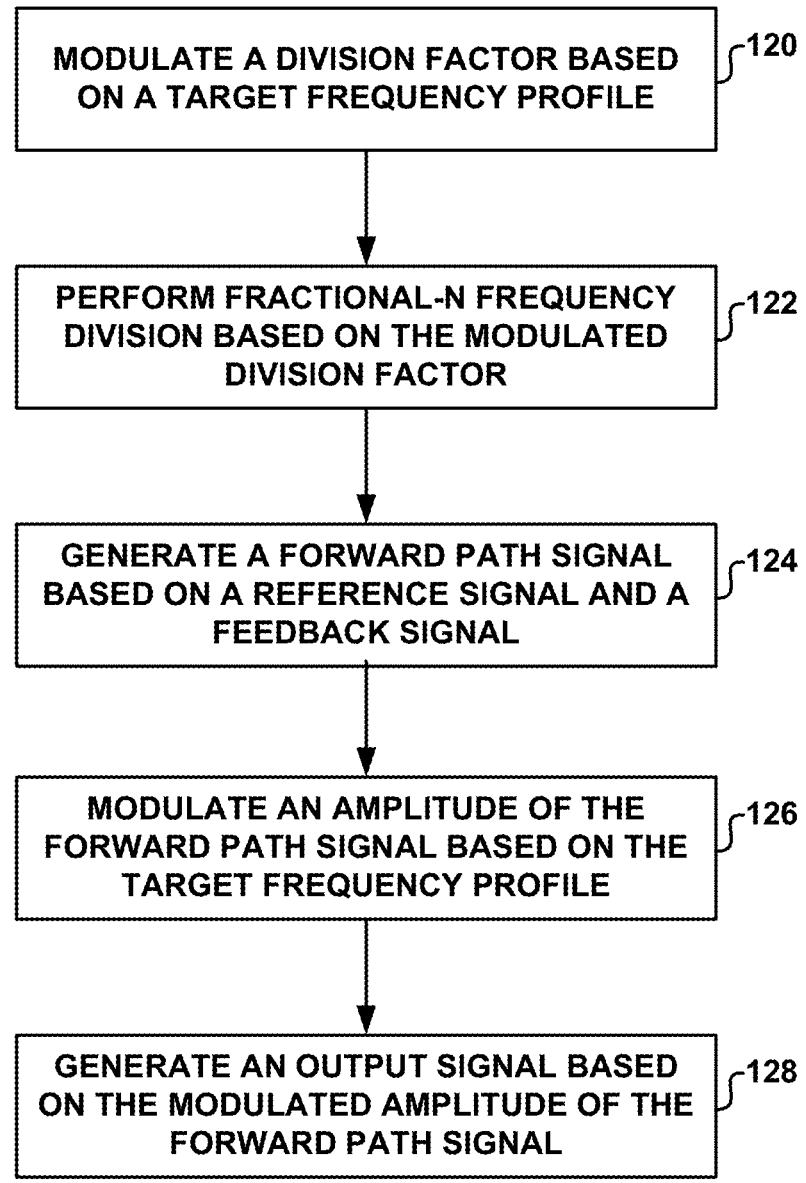
FIG. 5 is a flow diagram illustrating an example technique for generating signals that have relatively steep frequency profiles with a PLL circuit architecture according to this disclosure.

FIG. 5 is a flow diagram illustrating an example technique for generating signals that have relatively steep frequency profiles with a PLL circuit architecture according to this disclosure. In some examples, the technique shown in FIG. 5 may be implemented in any of PLL circuit 10 shown in FIG. 1, PLL circuit 50 shown in FIG. 2, and PLL circuit 70 shown in FIG. 3.

Frequency divider controller 26 modulates a division factor used for performing fractional-N frequency division in PLL circuit 10 based on a target frequency profile to be generated by PLL circuit 10 (120). Frequency divider 24 performs fractional-N frequency division on output signal 14 of PLL circuit 10 based on the modulated division factor to generate feedback signal 32 (122). Phase detector 16 and/or loop filter 18 generate a forward path signal (e.g., filtered signal 36) in PLL circuit 10 based on reference signal 12 and feedback signal 32 (124).

Servo profile generator 28 and/or summing node 20 modulate an amplitude of the forward path signal (e.g., filtered signal 36) at a location (e.g., at summing node 20 between loop filter 18 and controlled oscillator 22) in a forward circuit path of PLL circuit 10 based on servo control signal 38 (126). Servo control signal 38 may have an amplitude profile that is determined based on the target frequency profile to be generated by PLL circuit 10.

Controlled oscillator 22 generates output signal 14 of PLL circuit 10 based on the modulated amplitude of the forward path signal (e.g., composite signal 40) of PLL circuit 10 such that a frequency profile of output signal 14 substantially corresponds to the target frequency profile (128). In some cases, controlled oscillator 22 may be said to adjust output signal 14 (e.g., adjust the frequency of output signal 14) based on the modulated amplitude of the forward path signal (e.g., composite signal 40) of PLL circuit 10 such that a frequency profile of output signal 14 substantially corresponds to the target frequency profile. In some examples, the output signal 14 generated by controlled oscillator 22 may be a modified output signal.

In some examples, in order to generate the forward path signal (e.g., filtered signal 36) of PLL circuit 10, phase detector 16 may generate a signal (e.g., phase difference signal 34) indicative of a phase difference between reference signal 12 and feedback signal 32. In such examples, loop filter 18 may, in some examples, filter the signal (e.g., phase difference signal 34) indicative of the phase difference between reference signal 12 and feedback signal 32 to generate the forward path signal. In such examples, the forward path signal may, in some examples, be a digital signal, phase detector 16 may be, in some examples, a binary phase detector, and loop filter 18 may be, in some examples, a digital loop filter.

In some examples, the forward path signal to be modulated may be inside of loop filter 18 instead of outside of loop filter 18 as shown in FIG. 1. In such examples, in order to generate output signal 14 of PLL circuit 10 based on the modulated amplitude of the forward path signal, loop filter 18 may, in some examples, filter the modulated amplitude of the forward path signal to generate a filtered signal. In such examples, controlled oscillator 22 may generate output signal 14 based on the filtered signal.

In some examples, in order to modulate the amplitude of the forward path signal, summing node 20 may add an amplitude of servo control signal 38 to the amplitude of the forward path signal (e.g., filtered signal 36) to generate the modulated amplitude of the forward path signal (e.g., composite signal 40). Injecting a control signal into the forward circuit path of PLL circuit 10 in this manner may allow, in some examples, PLL circuit 10 to generate output signals with relatively high frequency slew rates while not requiring loop filter 18 to support such slew rates. Not requiring loop filter 18 to support such slew rates may allow loop filter 18 to be designed to produce a relatively low amount of phase noise. In this way, PLL circuit 10 may be able to generate signals with relatively steep frequency profiles while still maintaining acceptable levels of phase noise.

In some examples, in order to generate output signal 14 of PLL circuit 10 based on the modulated amplitude of the forward path signal, controlled oscillator 22 may be configured to control a frequency of output signal 14 based on the modulated amplitude of the forward path signal (e.g., composite signal 40). For example, as the amplitude of the forward path signal increases, the frequency of output signal 14 increases. Similarly, as the amplitude of the forward path signal decreases, the frequency of output signal 14 decreases.

In some examples, the target frequency profile may be ramp frequency profile (e.g., a ramp function). In further examples, the target frequency profile may contain one or more discontinuities. In additional examples, the target frequency profile may be referred to as a predetermined frequency profile. In other words, the general type and/or general shape of the frequency profile, in such examples, may be determined prior to the operation of PLL circuit 10.

In further examples, servo control signal 38 may be a digital control signal. In such examples, servo control signal 38 may, in some examples, be stored as a sequence of digital values in a digital storage device. In some cases, the sequence of digital values may be stored in the form of a look-up table. In such examples, to generate servo control signal 38, servo profile generator 28 may, in some examples, retrieve and output the sequence of digital values. For example, for each clocking event that occurs in feedback signal 32, servo profile generator 28 may output a subsequent digital value in the sequence of digital values.

In some examples, the location of the forward circuit path of PLL circuit 10 at which the modulation of the forward path signal takes place may correspond to a location between loop filter 18 in the forward circuit path of PLL circuit 10 and controlled oscillator 22 in the forward circuit path of PLL circuit 10. In some examples, the location may correspond to summing node 20. In further examples, the location may correspond to a location inside of loop filter 18. Other examples are also possible. The forward circuit path of PLL circuit 10 may, in some examples, refer to the circuit path between phase detector 16 and controlled oscillator 22 of PLL circuit 10.

Figure 6:
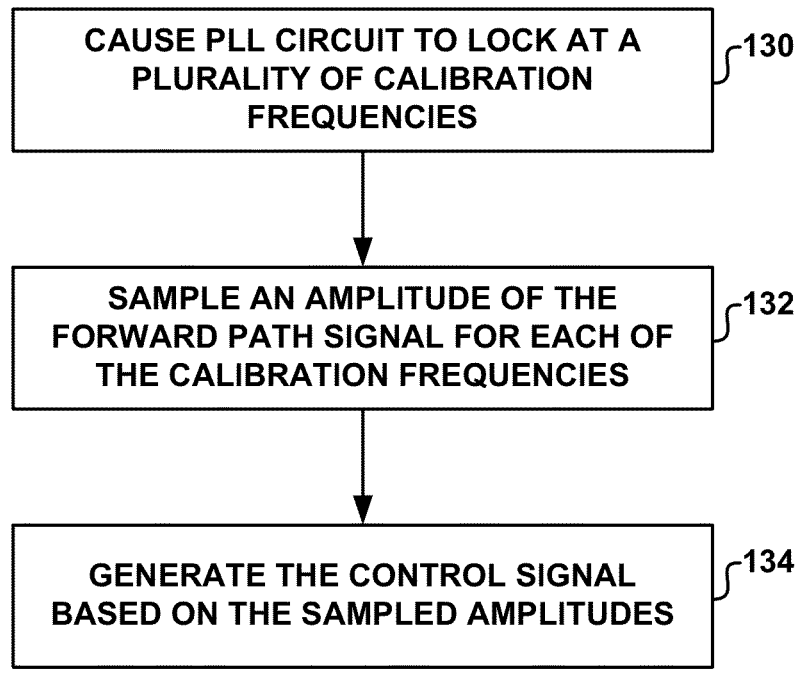
FIG. 6 is a flow diagram illustrating an example initial servo control signal calibration technique according to this disclosure.

FIG. 6 is a flow diagram illustrating an example initial servo control signal calibration technique according to this disclosure. In some examples, the technique shown in FIG. 6 may be implemented in any of PLL circuit 10 shown in FIG. 1, PLL circuit 50 shown in FIG. 2, and PLL circuit 70 shown in FIG. 3.

Calibration unit 30 causes PLL circuit 10 to lock at a plurality of calibration frequencies (130). For example, calibration unit 30 may cause a frequency of output signal 14 of PLL circuit 10 to lock at a plurality of calibration frequencies. Each of the calibration frequencies may correspond to a frequency included in the target frequency profile.

Calibration unit 30 samples an amplitude of the forward path signal for each of the calibration frequencies (132). For example, while PLL circuit 10 is locked at each of the plurality of calibration frequencies, calibration unit 30 may sample an amplitude of the forward path signal (e.g., composite signal 40) at a location in the forward circuit path of PLL circuit 10 to generate a respective one of a plurality of sampled amplitudes of the forward path signal. The location in the forward circuit path may be the same as the location at which the forward circuit path is modulated. Servo profile generator 28 generates servo control signal 38 based on the sampled amplitudes of the forward path signal (134).

Figure 7:
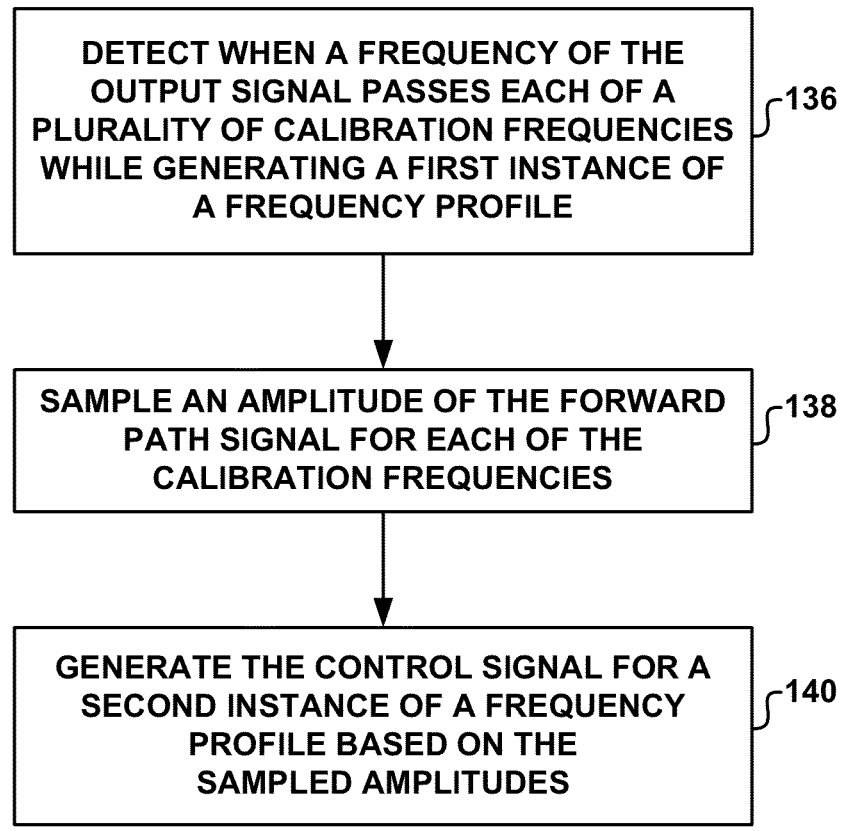
FIG. 7 is a flow diagram illustrating an example background servo control signal calibration technique according to this disclosure.

FIG. 7 is a flow diagram illustrating an example background servo control signal calibration technique according to this disclosure. In some examples, the technique shown in FIG. 7 may be implemented in any of PLL circuit 10 shown in FIG. 1, PLL circuit 50 shown in FIG. 2, and PLL circuit 70 shown in FIG. 3.

The technique shown in FIG. 7 may be used, for example, in cases where calibration unit 30 causes PLL circuit 10 to generate output signal 14 such that output signal 14 includes a sequence of instances of the target frequency profile. In other words, the target frequency profile may periodically repeat in output signal 14.

While generating a first instance of the target frequency profile in the output signal, calibration unit 30 detects when a frequency of the output signal passes each of a plurality of calibration frequencies (136). Calibration unit 30 samples an amplitude of the forward path signal for each of the calibration frequencies passed by the output signal (138). For example, for each of the calibration frequencies, in response to detecting that the frequency of the output signal has passed the respective calibration frequency, calibration unit 30 may sample an amplitude of the forward path signal (e.g., composite signal 40) at a location in the forward circuit path of PLL circuit 10 to generate a respective one of a plurality of sampled amplitudes of the forward path signal. The location in the forward circuit path may be the same as the location at which the forward circuit path is modulated.

Servo profile generator 28 generates servo control signal 38 for a second instance of a frequency profile based on the sampled amplitudes (140). For example, while PLL circuit 10 is generating a second instance of the target frequency profile in the output signal, servo profile generator 28 may generate the control signal based on the sampled amplitudes of the forward path signal. The second instance of the target frequency profile may occur after the first instance of the target frequency profile in the sequence of instances of the target frequency profile.

Another example background servo control signal calibration technique will now be described. This technique may be used, for example, in cases where calibration unit 30 causes PLL circuit 10 to generate output signal 14 such that output signal 14 includes a sequence of instances of the target frequency profile. In other words, the target frequency profile may periodically repeat in output signal 14.

While generating a first instance of the target frequency profile in output signal 14, calibration unit 30 samples an amplitude of the forward path signal at each of a plurality of instances in time. The amplitude of the forward path signal may be sampled at the same location in the forward circuit path of PLL circuit 10 as the location at which servo control signal 38 is applied to the forward circuit path (i.e., the location at which servo control signal 38 modulates the forward circuit path). For example, for the example PLL circuit 10 shown in FIG. 1, servo control signal 38 may be applied at a location between loop filter 18 and controlled oscillator 22 in the forward circuit path of PLL circuit 10 and calibration unit 30 may sample the amplitude of the forward path signal at the same location between loop filter 18 and controlled oscillator 22 of PLL circuit 10. Other example locations are possible (e.g., any location between phase detector 16 and controlled oscillator 22).

While generating a second instance of the target frequency profile in output signal 14, servo profile generator 28 generates servo control signal 38 based on the sampled amplitudes of the forward path signal. The second instance of the target frequency profile may occur after the first instance of the target frequency profile in the sequence of instances of the target frequency profile.

In some examples, the plurality of instances in time may correspond to predetermined and/or predefined time intervals. In such examples, calibration unit 30 may sample an amplitude of the forward path signal at each of a plurality of predetermined and/or predefined time intervals. In additional examples, one or more of the instances in time may correspond to respective time instances where calibration unit 30 expects PLL circuit 10 to output a respective one of a plurality of calibration frequencies. The time intervals between each of the instances of time at which calibration unit 30 samples the forward path signal may be substantially constant in some examples, and in other examples, may vary.

In radar applications frequency synthesizers are used to generate frequency modulated signals, mostly in the form of ramps (also called chirp modulation). In some examples, the techniques of this disclosure may use a digital PLL architecture to generate relatively fast ramps while still keeping a relatively low phase noise.

Figure 8:
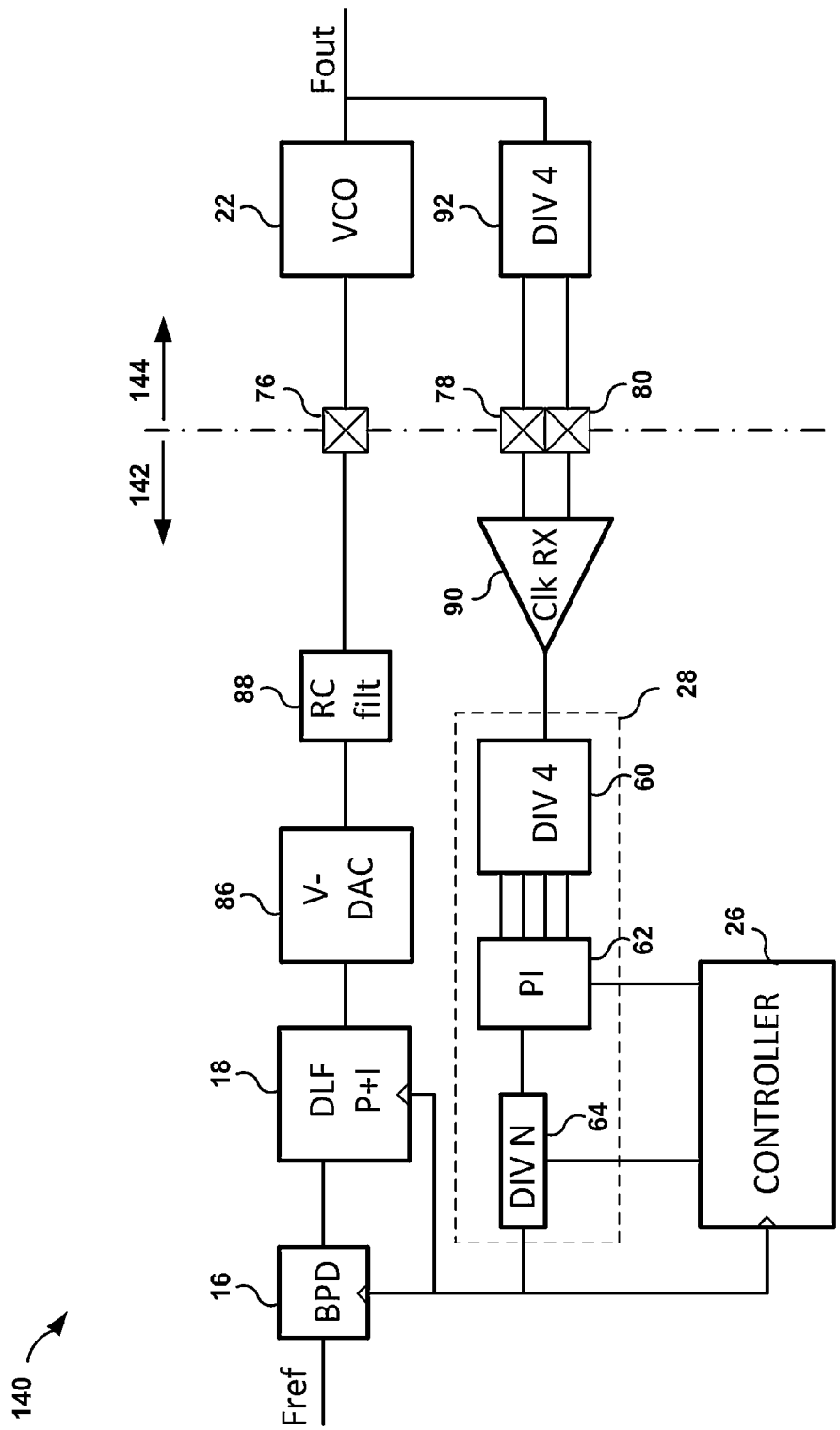
FIG. 8 is a block diagram illustrating an example PLL circuit that does not include a servo profile generator.

FIG. 8 is a block diagram illustrating an example PLL circuit 140 circuit that does not include a servo profile generator. The architecture may be applied to a case of an external VCO. PLL circuit 140 includes a digital chip 142, an analog chip 144, and terminals 76, 78, 80. Digital chip 142 includes a phase detector 16, a loop filter 18, a V-DAC 86, an RC filter 88, a buffer 90, a frequency divider 24, and a frequency divider controller 26. Analog chip 74 includes a voltage controlled oscillator 22 and a prescaler 92.

In this architecture an output frequency profile may be generated by properly programming the feedback divider factor over time. However, one drawback of the architecture shown in FIG. 8 is that, due to slew-limiting characteristics and phase noise characteristics, PLL circuit 140 may not necessarily be capable of supporting the generation of fast ramps, as may be used in radar applications, and at the same time, providing the required low phase noise.

Figure 9:
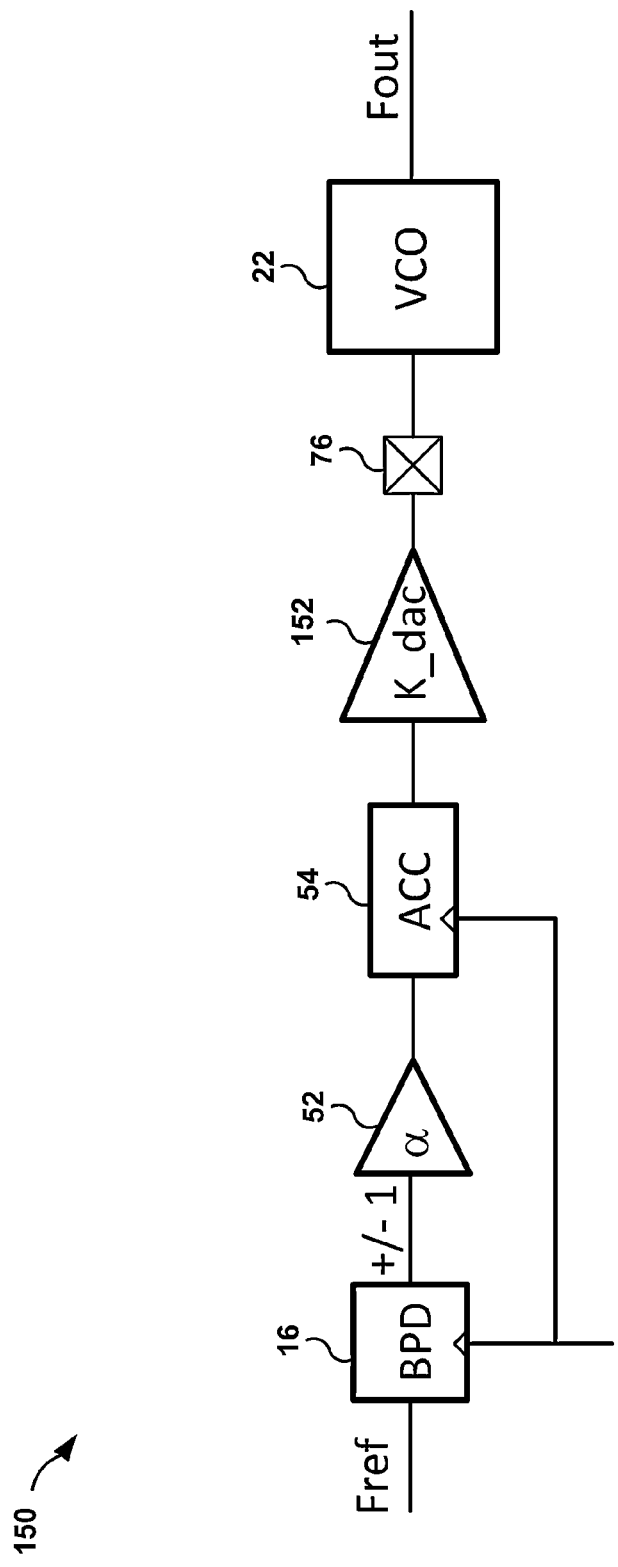
FIG. 9 is a conceptual diagram illustrating slew-limiting characteristics of the PLL circuit shown in FIG. 8.

FIG. 9 is a conceptual diagram illustrating model 150 of the slew-limiting characteristics of the PLL circuit shown in FIG. 8. Model 150 includes a phase detector 16, an integral gain block 52, an accumulator 54, a DAC resolution block 152, a terminal 76, and a voltage controlled oscillator 22. A PLL that uses a binary phase detector (BPD) may be a slew-rate limited system with respect to modulation. Because the maximum output of the BPD may be "1" (i.e., a value that is not proportional to the phase error itself), the maximum frequency slew-rate achievable at the VCO output may be equal to alpha*DACres*Kvco*Fref where alpha corresponds to the integral gain factor of loop filter 18 (e.g. integral gain block 52), DACres corresponds to the resolution of V-DAC 86 (e.g., DAC resolution block 152), Kvco corresponds to a contribution from controlled oscillator 22, and Fref corresponds to the reference frequency.

It follows that higher Fref, larger alpha, larger DAC_res are all better for achieving higher slew-rates. However, a larger alpha may result in larger beta (e.g., proportional gain factor) for stability reasons and this may increase the phase noise. Additionally, larger DAC_res may cause the beta coefficient to increase, which may also increase the phase noise.

In some examples, design parameters for an example PLL circuit may specify that the PLL circuit be capable of generating a ramp of 200 megahertz (MHz) at the output of the PLL circuit in 50 microseconds (us). In other words, the design parameters may specify that such a PLL circuit should be capable of achieving a slew rate of 200 MHz/50 us=4e12 Hertz per second (Hz/s). Assuming a reference frequency of 20 MHz and a Kvco=800 MHz/Volt (V), the loop filter parameters that are capable of satisfying such design parameters may be Alpha=1, Beta=8 and DAC_res=400 microvolt/least significant bit (uV/LSB).

Figure 10:
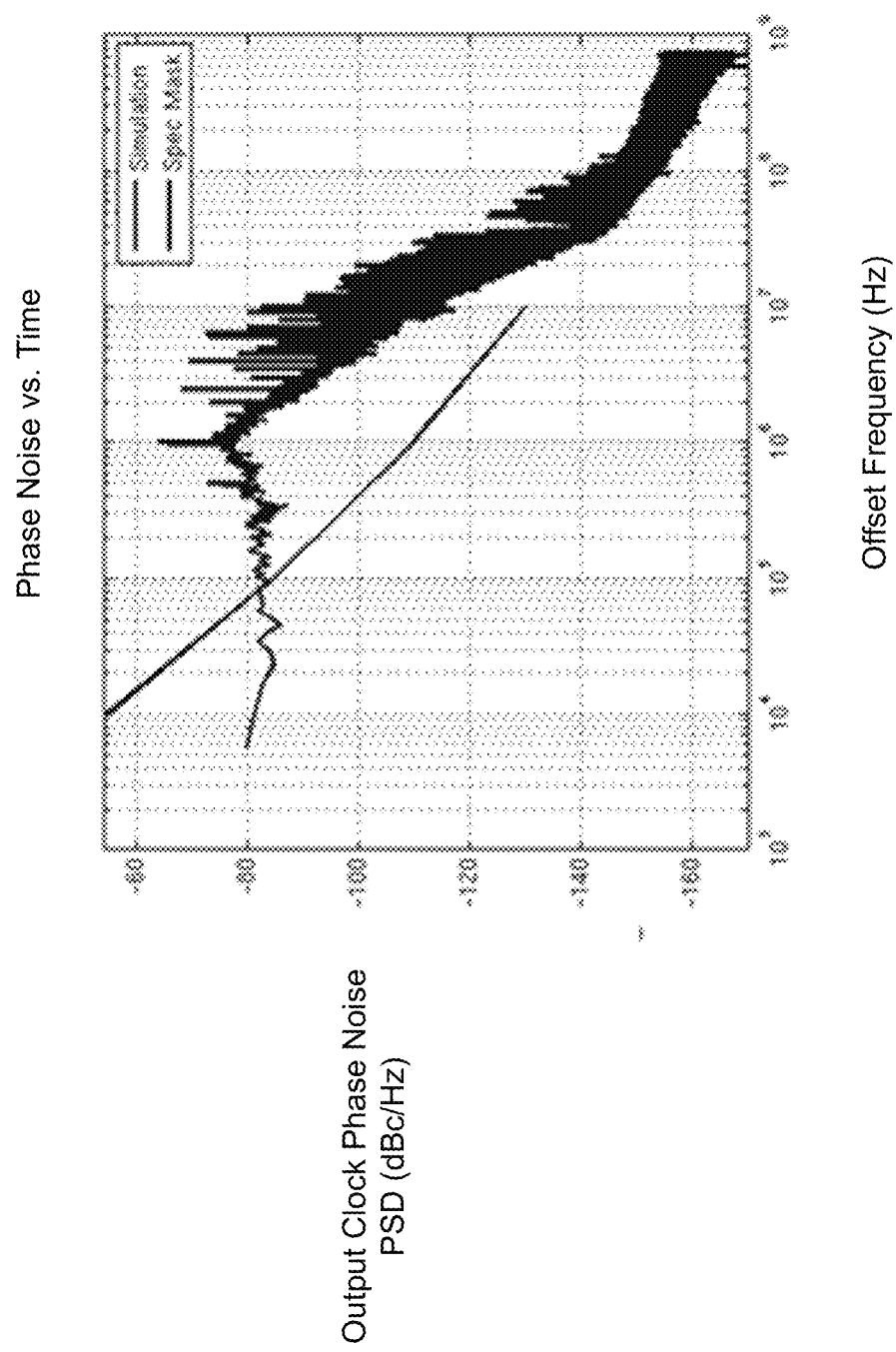
FIG. 10 is a graph illustrating simulated phase noise that may result from using the example PLL circuit shown in FIG. 8.

FIG. 10 is a graph illustrating simulated phase noise (i.e., jagged line) that may result from using the example PLL circuit shown in FIG. 8 with the above-described parameters (assuming a perfectly linear VCO and DAC). The black solid line in FIG. 10 depicts the phase noise specified by the design parameters. As shown in FIG. 10, the simulated phase noise is greater than the maximum amount of phase noise specified for the circuit. Thus, the example PLL circuit 140 shown in FIG. 8 does not appear capable of generating a relatively high slew-rate signal while maintaining acceptable levels phase noise.

The techniques of this disclosure may, in some examples, be used to introduce a mechanism into the digital loop filter or other portion of the PLL forward circuit path to generate a servo-ramp. The servo-ramp may support the PLL in the generation of frequency chirps. Because the start and stop frequency of the ramp are known, in some examples, the servo-ramp may, in such examples, be generated relatively easily in the digital domain, and added to the output of the loop filter.

One example of a proposed architecture for introducing the servo-ramp into the forward signal path of the PLL circuit is illustrated in FIG. 3. With the introduction of the servo-ramp, the core of the loop filter (i.e., the integral path determined by alpha) does not need to generate, by itself, the whole ramp needed to produce the chirp. Instead, the core of the loop filter may, in some cases, merely compensate for the differences between the generated servo-ramp and the loop filter output which is needed to produce the target chirp (e.g., target frequency profile). This difference would be zero in the case of ideally linear DAC and VCO characteristics, but in reality there may be some difference. If the VCO and DAC non-idealities are kept small, then the alpha factor and the resolution of the DAC can be substantially reduced with respect to their value needed in absence of the servo ramp. Note that this approach does not necessarily remove the fractional-N divider in the feedback path, which may still be operated as in the version without servo-ramp shown in FIG. 8.

Figure 11:
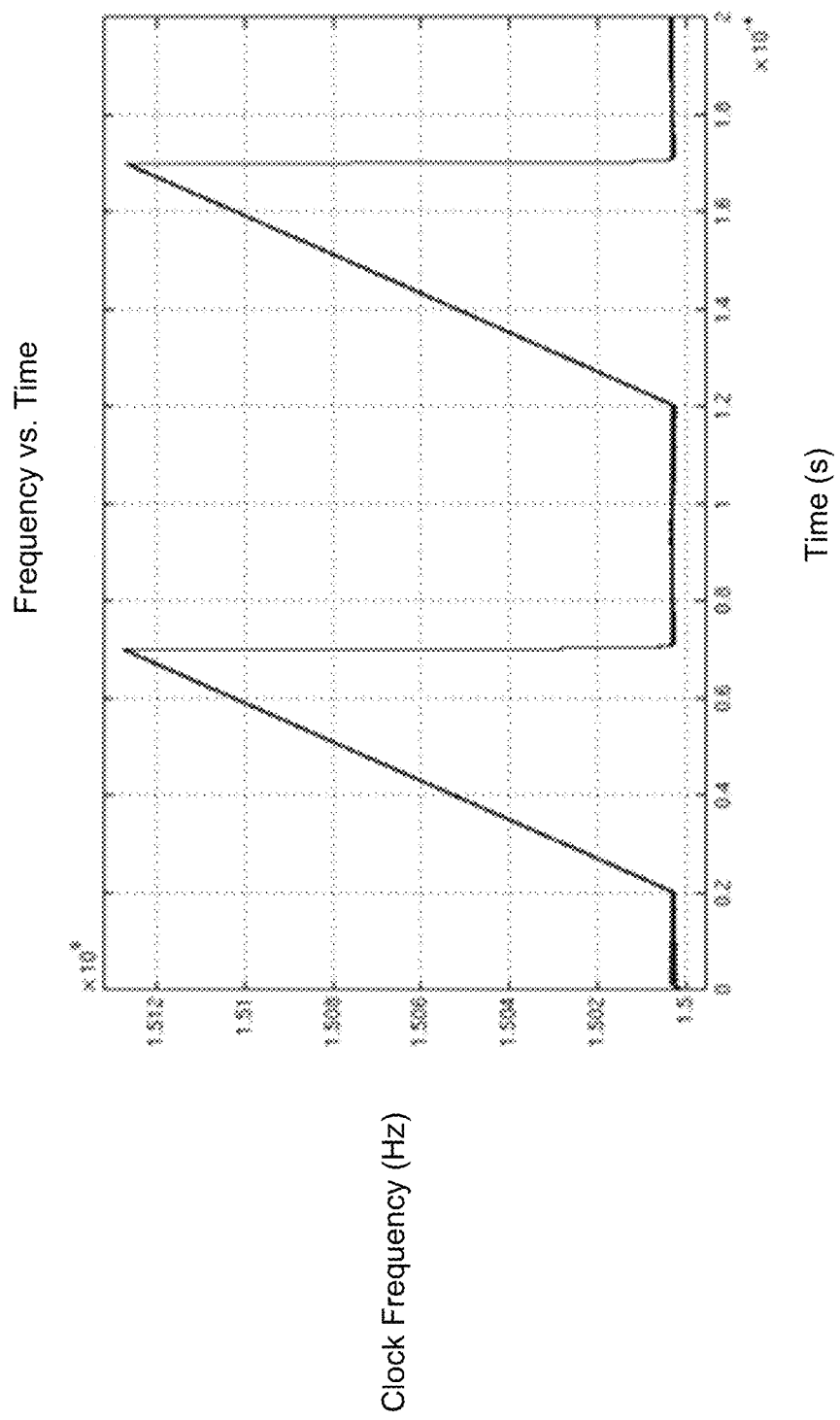
FIG. 11 is a graph illustrating example simulation results for a sawtooth ramp frequency profile that may be generated by the PLL circuit shown in FIG. 3.
Figure 12:
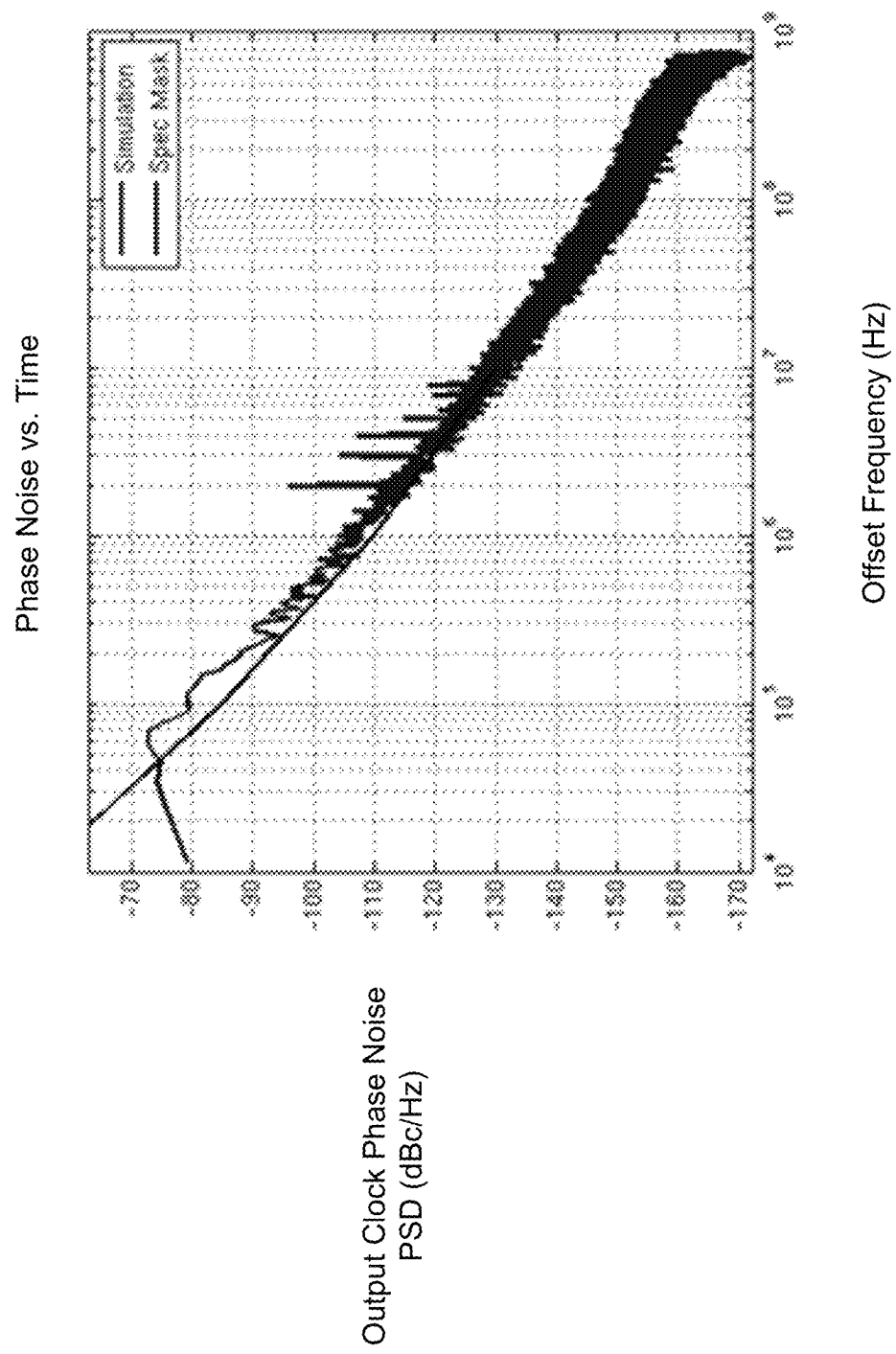
FIG. 12 is a graph illustrating simulated phase noise characteristics that may result from using the example PLL circuit shown in FIG. 3.

FIG. 11 is a graph illustrating example simulation results for a sawtooth ramp frequency profile that may be generated by the PLL circuit shown in FIG. 3. FIG. 12 is a graph illustrating simulated phase noise that may result from using the example PLL circuit shown in FIG. 3. These simulations may assume perfectly linear VCO and DAC, and parameters Alpha=2^-6, Beta=0.5 and DAC_res=100 uV/LSB. As shown in FIG. 12, the techniques of this disclosure may be able to achieve a better phase noise characteristic. Note that the frequency on the y-Axis of FIG. 11 is the VCO frequency (24 GHZ) divided by 16.

Voltage and temperature variations may cause changes in the characteristic of the VCO and of the DAC. In order to track these changes, the servo ramp generation techniques of this disclosure may, in some examples, be supported by one or both of an initial calibration of the DAC and VCO, and a continuous background calibration during the generation of a sequence of ramps.

Referring back to FIG. 4, during the initial calibration, the PLL may be locked at multiple frequencies (e.g., Fcal1, Fcal2, Fcal3, etc.) along the frequency range of interest for the ramp generation (e.g., from 24 GHz to 24.2 GHz). The values of the loop filter outputs may correspond to those frequencies that are stored is a memory and used to calculate the ramp. The minimum number of support points may be two (i.e., the initial and the final). In case the VCO tuning curve is particularly non-linear, additional support points may be introduced in between, in order to approximate better the real VCO tuning curve. In this case, the generated ramp (i.e., a "Multi-point Servo Ramp") may not generally have a constant slope. This may imply an increase in the complexity, but may nevertheless be beneficial for phase noise performances.

For the ramp generation, the loop filter may be reset to a value corresponding to the starting frequency and the servo ramp may be generated according to the parameters calculated during the calibration phase. While sweeping the frequency range of interest, the loop filter values stored in the memory may be updated as soon as the ramp is passing through the calibration frequencies (e.g., Fcal1, Fcal2, Fcal3 . . . ), so that possible slow changes in the DAC and VCO characteristics are tracked. For the next cycle, the ramp may be calculated based on the parameters stored during the previous ramp and the cycle is repeated.

It should be noted that for the generation of the saw-tooth profile, the steep part of the waveform may be generated by resetting the value of the loop filter to the value corresponding to the start of the ramp stored in the memory, and resetting the feedback divider to the proper divider factor.

In some examples, the techniques of this disclosure may be used to store and/or load the values of the loop filter output at some specific frequencies in order to perform non-linear operations on the chirp profiles. Performing non-linear operations on chirp profiles may be particularly difficult to generate with analog PLLs.

In some examples, the techniques of this disclosure may introduce a servo-profile (e.g., a servo-ramp) in the digital loop filter of a digital PLL in order to ease the generation of the chirp profiles with low PLL bandwidths. In further examples, the techniques of this disclosure may provide initial and background calibration of the servo-profiles. In some examples, the calibration techniques may not require the use of DACs and/or ADCs for purposes of sampling values and inserting such values into the control loop. In further examples, techniques of this disclosure may be used to store and/or load the values of/in the loop filter at specific frequencies in order to perform non-linear operations on the chirp profiles.

In some examples, the techniques of this disclosure may use the circuit architecture depicted in FIG. 3. In further examples, the techniques of this disclosure may use a circuit architecture similar to the circuit architecture depicted in FIG. 3 except that controlled oscillator 22 and prescaler 92 may be placed on the same chip as the other components and buffer 90 may be omitted. In further examples, the techniques of this disclosure may use a circuit architecture similar to the circuit architecture depicted in FIG. 3 except that controlled oscillator 22 and prescaler 92 may be placed on the same chip as the other components, buffer 90 may be omitted, controlled oscillator 22 (which is a VCO in FIG. 3) may be replaced by a DCO, and V-DAC 86 and RC filter 88 may be omitted.

Various techniques described in this disclosure may be implemented in hardware, software, firmware or any combination thereof. For example, various aspects of the techniques may be implemented within or in conjunction with one or more microprocessors, digital signal processors (DSPs), application specific integrated circuits (ASICs), field programmable logic arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

When implemented in hardware, the circuit components described in this disclosure may be implemented as one or more discrete components, as one or more integrated devices, or any combination thereof. The circuit components described herein may be fabricated using any of a wide variety of process technologies including Complementary Metal-Oxide-Semiconductor (CMOS) process technologies.

When implemented in software, the functionality ascribed to the systems and devices described in this disclosure may be embodied as instructions on a computer-readable medium such as random access memory (RAM), read-only memory (ROM), non-volatile random access memory (NVRAM), electrically erasable programmable read-only memory (EEPROM), FLASH memory, magnetic media, optical media, or the like. The instructions may be executed to cause a processor to perform or support one or more aspects of the functionality described in this disclosure.

Various aspects and examples have been described. However, modifications can be made to the structure or techniques of this disclosure without departing from the scope of the following claims.

The invention claimed is:

1. A method comprising:
modulating a division factor based on a target frequency profile to be generated by a phase locked loop (PLL) circuit;
performing fractional-N frequency division on an output signal of the PLL circuit based on the modulated division factor to generate a feedback signal, wherein N is a non-integer fraction;
generating a forward path signal in the PLL circuit based on a reference signal and the feedback signal;
modulating an amplitude of the forward path signal at a location in a forward circuit path of the PLL circuit based on a control signal, the control signal having an amplitude profile that is determined based on the target frequency profile to be generated by the PLL circuit; and
generating the output signal of the PLL circuit based on the modulated amplitude of the forward path signal of the PLL circuit such that a frequency profile of the output signal substantially corresponds to the target frequency profile.

2. The method of claim 1, wherein generating the forward path signal in the PLL circuit comprises:
generating a signal indicative of a phase difference between the reference signal and the feedback signal; and
filtering the signal indicative of the phase difference between the reference signal and the feedback signal to generate the forward path signal.

3. The method of claim 2,
wherein the forward path signal is a digital forward path signal,
wherein generating the signal indicative of the phase difference between the reference signal and the feedback signal comprises generating, with a binary phase detector, the signal indicative of the phase difference between the reference signal and the feedback signal, and
wherein filtering the signal indicative of the phase difference between the reference signal and the feedback signal comprises, filtering, with a digital filter, the signal indicative of the phase difference between the reference signal and the feedback signal to generate the digital forward path signal.

4. The method of claim 2,
wherein the forward path signal is a digital forward path signal,
wherein generating the signal indicative of the phase difference between the reference signal and the feedback signal comprises generating, with a time-to-digital converter (TDC) phase detector, the signal indicative of the phase difference between the reference signal and the feedback signal, and
wherein filtering the signal indicative of the phase difference between the reference signal and the feedback signal comprises, filtering, with a digital filter, the signal indicative of the phase difference between the reference signal and the feedback signal to generate the digital forward path signal.

5. The method of claim 1, wherein generating the output signal of the PLL circuit based on the modulated amplitude of the forward path signal comprises:
filtering the modulated amplitude of the forward path signal to generate a filtered signal, and
generating the output signal of the PLL circuit based on the filtered signal.

6. The method of claim 1, wherein modulating the amplitude of the forward path signal comprises adding an amplitude of the control signal to the amplitude of the forward path signal to generate the modulated amplitude of the forward path signal.

7. The method of claim 1, wherein generating the output signal of the PLL circuit based on the modulated amplitude of the forward path signal comprises:
controlling a frequency of the output signal based on the modulated amplitude of the forward path signal.

8. The method of claim 1, wherein the location of the forward circuit path of the PLL circuit comprises a location between a loop filter in the forward circuit path of the PLL circuit and a controlled oscillator in the forward circuit path of the PLL circuit.

9. The method of claim 1, further comprising:
generating the control signal based on a plurality of digital values stored in a look-up table.

10. The method of claim 1, further comprising:
causing a frequency of the output signal of the PLL circuit to lock at a plurality of calibration frequencies, each of the calibration frequencies corresponding to a frequency included in the target frequency profile;
while the PLL circuit is locked at each of the plurality of calibration frequencies, sampling an amplitude of the forward path signal at the location in the forward circuit path of the PLL circuit to generate a respective one of a plurality of sampled amplitudes of the forward path signal; and generating the control signal based on the sampled amplitudes of the forward path signal.

11. The method of claim 1, further comprising:

generating the output signal of the PLL circuit such that the output signal includes a sequence of instances of the target frequency profile;

while generating a first instance of the target frequency profile in the output signal, detecting when a frequency of the output signal passes each of a plurality of calibration frequencies;

for each of the calibration frequencies, in response to detecting that the frequency of the output signal has passed the respective calibration frequency, sampling an amplitude of the forward path signal at the location in the forward circuit path of the PLL circuit to generate a respective one of a plurality of sampled amplitudes of the forward path signal; and while generating a second instance of the target frequency profile in the output signal, generating the control signal based on the sampled amplitudes of the forward path signal, the second instance of the target frequency profile occurring after the first instance of the target frequency profile in the sequence of instances of the target frequency profile.

12. The method of claim 1, further comprising:

generating the output signal of the PLL circuit such that the output signal includes a sequence of instances of the target frequency profile;

while generating a first instance of the target frequency profile in the output signal, sampling an amplitude of the forward path signal at each of a plurality of instances in time, the amplitude of the forward path signal being sampled at the location in the forward circuit path of the PLL circuit; and while generating a second instance of the target frequency profile in the output signal, generating the control signal based on the sampled amplitudes of the forward path signal, the second instance of the target frequency profile occurring after the first instance of the target frequency profile in the sequence of instances of the target frequency profile.

13. The method of claim 1, wherein the target frequency profile is at least one of a ramp function, a sawtooth function, and a triangle function.

14. A device comprising:

a phase locked loop (PLL) circuit including a frequency divider and a frequency divider controller, wherein the PLL circuit is configured to:

use the frequency divider controller to modulate a division factor based on a target frequency profile to be generated by the PLL circuit;

use the frequency divider to perform fractional-N frequency division on an output signal of the PLL circuit based on the modulated division factor to generate a feedback signal, wherein N is a non-integer fraction;

generate a forward path signal based on a reference signal and the feedback signal;

modulate an amplitude of the forward path signal at a location in a forward circuit path of the PLL circuit based on a control signal, the control signal having an amplitude profile that is determined based on the target frequency profile to be generated by the PLL circuit; and generate the output signal of the PLL circuit based on the modulated amplitude of the forward path signal such that a frequency profile of the output signal substantially corresponds to the target frequency profile.

15. The device of claim 14, wherein the PLL circuit is further configured to:

generate a signal indicative of a phase difference between the reference signal and the feedback signal; and filter the signal indicative of the phase difference between the reference signal and the feedback signal to generate the forward path signal.

16. The device of claim 15, wherein the forward path signal is a digital forward path signal, and wherein the PLL circuit further includes:

a binary phase detector configured to generate the signal indicative of the phase difference between the reference signal and the feedback signal; and a digital filter configured to filter the signal indicative of the phase difference between the reference signal and the feedback signal to generate the digital forward path signal.

17. The device of claim 15, wherein the forward path signal is a digital forward path signal, and wherein the PLL circuit further includes:

a time-to-digital converter (TDC) phase detector configured to generate the signal indicative of the phase difference between the reference signal and the feedback signal; and a digital filter configured to filter the signal indicative of the phase difference between the reference signal and the feedback signal to generate the digital forward path signal.

18. The device of claim 14, wherein the PLL circuit is further configured to:

filter the modulated amplitude of the forward path signal to generate a filtered signal; and generate the output signal of the PLL circuit based on the filtered signal.

19. The device of claim 14, wherein PLL circuit is further configured to add an amplitude of the control signal to the amplitude of the forward path signal to generate the modulated amplitude of the forward path signal.

20. The device of claim 14, wherein the PLL circuit is further configured to:

control a frequency of the output signal based on the modulated amplitude of the forward path signal.

21. The device of claim 14, wherein the location of the forward circuit path of the PLL circuit comprises a location between a loop filter in the forward circuit path of the PLL circuit and a controlled oscillator in the forward circuit path of the PLL circuit.

22. The device of claim 14, wherein the PLL circuit is further configured to generate the control signal based on a plurality of digital values stored in a look-up table.

23. The device of claim 14, wherein the PLL circuit is further configured to:

cause a frequency of the output signal of the PLL circuit to lock at a plurality of calibration frequencies, each of the calibration frequencies corresponding to a frequency included in the target frequency profile;

while the PLL circuit is locked at each of the plurality of calibration frequencies, sample an amplitude of the forward path signal at the location in the forward circuit path of the PLL circuit to generate a respective one of a plurality of sampled amplitudes of the forward path signal; and generate the control signal based on the sampled amplitudes of the forward path signal.

24. The device of claim 14, wherein the PLL circuit is further configured to:

generate the output signal of the PLL circuit such that the output signal includes a sequence of instances of the target frequency profile;

while generating a first instance of the target frequency profile in the output signal, detect when a frequency of the output signal passes each of a plurality of calibration frequencies;

for each of the calibration frequencies, in response to detecting that the frequency of the output signal has passed the respective calibration frequency, sample an amplitude of the forward path signal at the location in the forward circuit path of the PLL circuit to generate a respective one of a plurality of sampled amplitudes of the forward path signal; and while generating a second instance of the target frequency profile in the output signal, generate the control signal based on the sampled amplitudes of the forward path signal, the second instance of the target frequency profile occurring after the first instance of the target frequency profile in the sequence of instances of the target frequency profile.

25. The device of claim 14, wherein the PLL circuit is further configured to:

generate the output signal of the PLL circuit such that the output signal includes a sequence of instances of the target frequency profile;

while generating a first instance of the target frequency profile in the output signal, sample an amplitude of the forward path signal at each of a plurality of instances in time, the amplitude of the forward path signal being sampled at the location in the forward circuit path of the PLL circuit; and while generating a second instance of the target frequency profile in the output signal, generate the control signal based on the sampled amplitudes of the forward path signal, the second instance of the target frequency profile occurring after the first instance of the target frequency profile in the sequence of instances of the target frequency profile.

26. The device of claim 14, wherein the target frequency profile is at least one of a ramp function, a sawtooth function, and a triangle function.

27. An apparatus comprising:

means for modulating a division factor in a phase-locked loop (PLL) circuit based on a target frequency profile to be generated by the PLL circuit;

means for performing fractional-N frequency division on an output signal of the PLL circuit based on the modulated division factor to generate a feedback signal, wherein N is a non-integer fraction;

means for generating a forward path signal in the PLL circuit based on a reference signal and the feedback signal;

means for modulating an amplitude of the forward path signal at a location in a forward circuit path of the PLL circuit based on a control signal, the control signal having an amplitude profile that is determined based on the target frequency profile to be generated by the PLL circuit; and means for generating the output signal of the PLL circuit based on the modulated amplitude of the forward path signal of the PLL circuit such that a frequency profile of the output signal substantially corresponds to the target frequency profile.

\* \* \* \* \*